(12) United States Patent
Imai et al.

(10) Patent No.: US 8,586,202 B2
(45) Date of Patent: Nov. 19, 2013

(54) ORGANIC ELECTROLUMINESCENT DEVICE AND DISPLAY DEVICE

(75) Inventors: Yoshiaki Imai, Kanagawa (JP); Yasunori Kijima, Tokyo (JP); Emiko Kambe, Kanagawa (JP); Tadahiko Yoshinaga, Kanagawa (JP)

(73) Assignee: Sony Corporation, Tokyo (JP)

( * ) Notice: Subject to any disclaimer, the term of this patent is extended or adjusted under 35 U.S.C. 154(b) by 420 days.

(21) Appl. No.: 12/730,689

(22) Filed: Mar. 24, 2010

(65) Prior Publication Data

US 2010/0253214 A1    Oct. 7, 2010

(30) Foreign Application Priority Data

Apr. 7, 2009    (JP) ................................ 2009-092853

(51) Int. Cl.
*H01L 51/54*    (2006.01)
(52) U.S. Cl.
USPC ............ 428/690; 428/917; 313/504; 313/506
(58) Field of Classification Search
None
See application file for complete search history.

(56) References Cited

U.S. PATENT DOCUMENTS

| | | | |
|---|---|---|---|
| 7,063,902 B2 * | 6/2006 | Kikuchi et al. ............... | 428/690 |
| 2003/0082469 A1 * | 5/2003 | Tamura ....................... | 430/59.5 |
| 2006/0172147 A1 * | 8/2006 | Matsuura et al. ............ | 428/690 |
| 2006/0220534 A1 * | 10/2006 | Shibanuma et al. .......... | 313/504 |
| 2007/0141395 A1 * | 6/2007 | Chun et al. ................... | 428/690 |
| 2007/0164280 A1 * | 7/2007 | Maekawa et al. .............. | 257/59 |
| 2008/0023724 A1 * | 1/2008 | Takeda et al. ................ | 257/103 |
| 2008/0145701 A1 * | 6/2008 | Dunbar et al. ................ | 428/690 |
| 2008/0296600 A1 * | 12/2008 | Kwack et al. .................. | 257/98 |
| 2008/0305360 A1 * | 12/2008 | Han et al. ..................... | 428/690 |
| 2009/0066237 A1 * | 3/2009 | Kambe et al. ................ | 313/504 |

FOREIGN PATENT DOCUMENTS

JP    2005-235585    9/2005
JP    2006-156390    6/2006

* cited by examiner

*Primary Examiner* — Dawn Garrett
(74) *Attorney, Agent, or Firm* — Dentons US LLP

(57) ABSTRACT

An organic electroluminescent device, includes: an anode and a cathode of inorganic conducting material; an organic emission functional layer interposed between the anode and the cathode, and that includes an organic emissive layer; and an organic electrode film provided in contact with an outer side of at least one of the anode and the cathode, wherein the organic electrode film is formed using at least one of (I) a combination of a polycyclic aromatic hydrocarbon compound having a backbone of 3- to 7-membered rings, and a benzoimidazole derivative having a substituent in the benzene ring, and (II) an azatriphenylene derivative.

12 Claims, 8 Drawing Sheets

Tr1 SWITCHING TRANSISTOR
(THIN-FILM TRANSISTOR)

Tr2 DRIVING TRANSISTOR
(THIN-FILM TRANSISTOR)

EL ORGANIC ELECTROLUMINESCENT
DEVICE (1-1 TO 1-6)

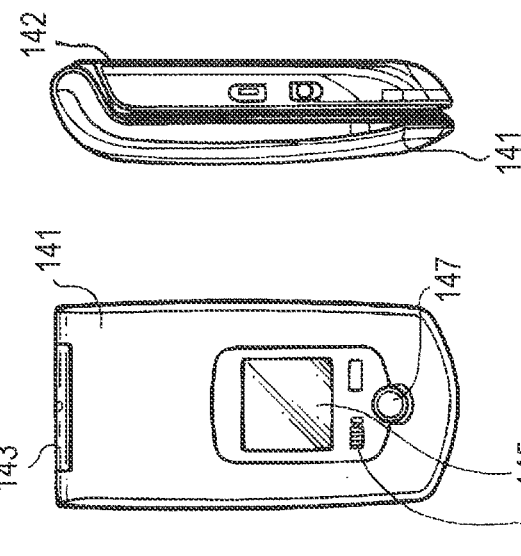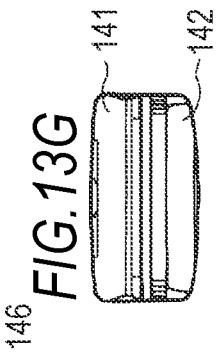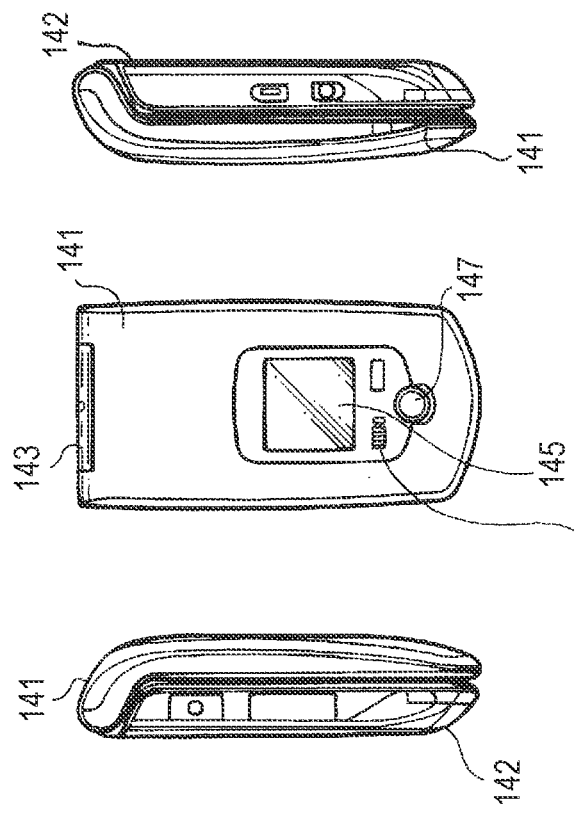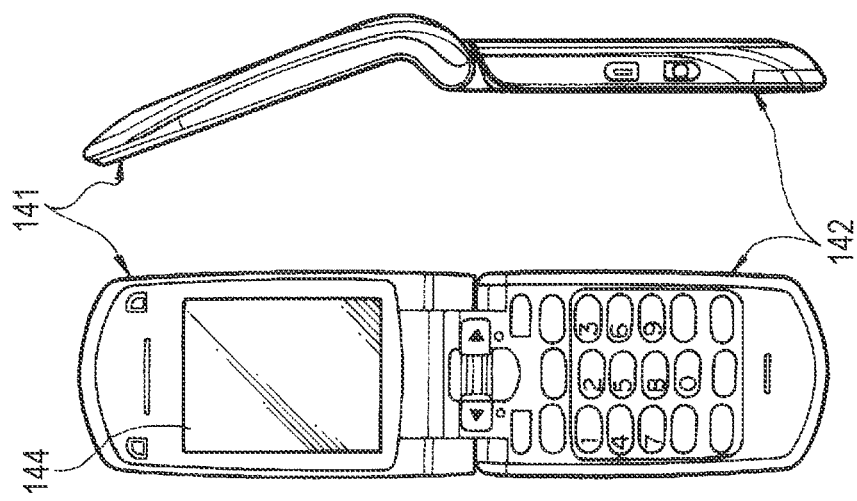

ORGANIC ELECTROLUMINESCENT DEVICE AND DISPLAY DEVICE

BACKGROUND OF THE INVENTION

1. Field of the Invention

The present invention relates to organic electroluminescent devices (also known as organic EL devices) and display devices, particularly to organic electroluminescent devices and display devices that include a thin electrode of inorganic material protected by a conductive organic material.

2. Description of the Related Art

Organic electroluminescent devices (also known as organic EL devices) utilizing the electroluminescence (hereinafter, "EL") of organic materials are structured to include a stacked organic emission functional layer of an organic hole transport layer and an organic emissive layer between the anode and cathode. Such organic electroluminescent devices are of interest as light-emitting devices capable of emitting bright light by low-voltage DC driving.

In such organic electroluminescent devices, it has been proposed to stack a conductive organic film on the cathode or anode to complement conductivity of the cathode or anode, for which inorganic transparent conductive films such as ITO and IZO, or extremely thin metallic material films are used. As an example, polyethylenedioxythiophene (PEDOT) is used as the stacked conductive organic film (see JP-A-2005-235585)

Further, in the organic electroluminescent device, it has been proposed to stack an organic capping film on one of the anode and cathode disposed on the opposite side from the substrate, in order to prevent degradation of organic material due to moisture penetration. The organic capping film is formed using allylene diamine derivatives, triamine derivatives, CBP, and an aluminum-quinolinol complex (Alq3) (see JP-A-2006-156390).

SUMMARY OF THE INVENTION

However, the configuration providing the conductive organic film of PEDOT on the electrode has a slow deposition rate and suffers from poor productivity because the PEDOT is a polymer. Further, though wet deposition is possible, the organic layer such as an organic emissive layer is damaged by the solvent when the conductive organic film of PEDOT is formed in wet settings.

The configuration providing the organic capping film of materials such as allylene diamine derivatives, triamine derivatives, CBP, and an aluminum-quinolinol complex (Alq3) on the electrode fails to complement conductivity of the anode or cathode because the conductivity of these materials is poor.

Accordingly, there is a need for an organic electroluminescent device intended to improve emission efficiency by the provision of an organic material film that can be formed with good productivity and can sufficiently complement the conductivity of the thin electrode.

According to an embodiment of the present invention, there is provided an organic electroluminescent device including: an organic emission functional layer interposed between an anode and a cathode of inorganic conducting material, and that includes an organic emissive layer; and an organic electrode film provided in contact with an outer side of at least one of the anode and the cathode. The organic electrode film is formed using at least one of (I) a combination of a polycyclic aromatic hydrocarbon compound and a benzoimidazole derivative, and (II) an azatriphenylene derivative. The polycyclic aromatic hydrocarbon compound is a compound with a backbone of 3- to 7-membered rings. The benzoimidazole derivative is a compound with a substituent in the benzene ring.

According to another embodiment of present invention, there is provided a display device including the organic electroluminescent devices of such a configuration arrayed on a substrate.

In the organic electroluminescent device of the configuration above, the organic electrode film provided in contact with the cathode or anode is formed using a low molecular material. This enables the organic electrode film to be formed at a faster vapor deposition rate than in the polymer, and thus improves productivity. Further, because the organic electrode film is sufficiently conductive, it can complement the conductivity of the electrode provided in contact with the organic electrode film. As demonstrated in the Example section below, the organic electroluminescent device provided with the organic electrode film is capable of low-voltage driving.

As described above, according to an embodiment of the present invention, the emission efficiency of the organic electroluminescent device can be improved by the provision of the organic material film that can be formed with good productivity and can sufficiently complement the conductivity of the thin electrode. Accordingly, the display characteristics of the display device using the organic electroluminescent device can be improved.

BRIEF DESCRIPTION OF THE DRAWINGS

FIGS. 10A and 10B are perspective views of a digital camera using a display device of an embodiment of the present invention, in which FIG. 10A is a front perspective view, and FIG. 10B is a rear perspective view.

FIGS. 13A to 13G are perspective views of a portable terminal device using a display device of an embodiment of the present invention, for example, a cellular phone, in which FIG. 13A is an open front view, FIG. 13B is an open side view, FIG. 13C is a closed front view, FIG. 13D is a left side view, FIG. 13E is a right side view, FIG. 13F is a top view, and FIG. 13G is a bottom view.

DESCRIPTION OF THE PREFERRED EMBODIMENTS

Embodiments of the present invention are described below in the following order.

1. First Embodiment
   An example of an organic electroluminescent device provided with an organic electrode film on the upper electrode cathode.
2. Second Embodiment
   An example of an organic electroluminescent device provided with an organic electrode film on the upper electrode anode.
3. Third Embodiment
   An example of an organic electroluminescent device provided with an organic electrode film on both the anode and cathode sides.
4. Fourth Embodiment
   An example of a reverse-stacked organic electroluminescent device provided with an organic electrode film on both the anode and cathode sides.
5. Fifth Embodiment
   An example of an organic electroluminescent device provided with an organic electrode film on the lower electrode anode.
6. Sixth Embodiment
   An example of an organic electroluminescent device provided with an organic electrode film on the lower electrode cathode.
7. Seventh Embodiment
   An exemplary structure of a display device.
8. Eighth Embodiment
   Applications to electronic devices.

<1. First Embodiment>

Figure 1:
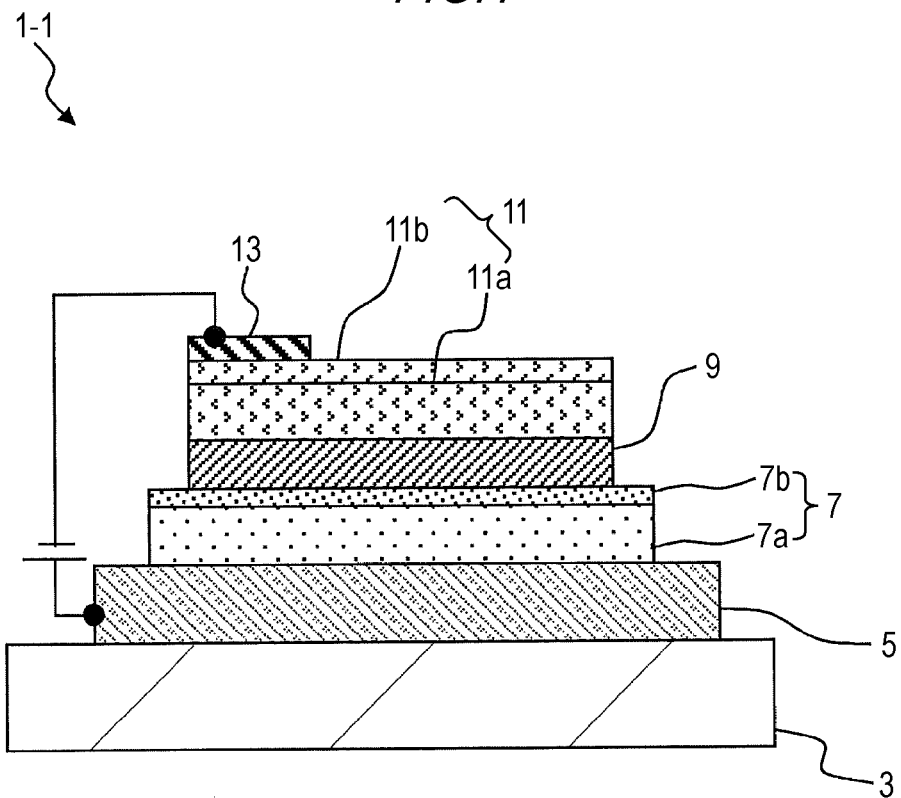
FIG. 1 is a cross sectional view of an organic electroluminescent device according to a First Embodiment.

FIG. 1 is a cross sectional view schematically illustrating an organic electroluminescent device 1-1 of an embodiment of the present invention. The organic electroluminescent device 1-1 is a first example suited for top emission, and includes an anode 5 provided as a lower electrode on a substrate 3, an organic emission functional layer 7 overlaid on the anode 5, and a cathode 9 provided as an upper electrode on the organic emission functional layer 7. Further, an organic electrode film 11 and a cathode wire 13 are provided on the cathode 9. A characteristic of an embodiment of the present invention is that the organic electrode film 11 is formed using the materials described below.

The following description will be given through the case where the organic electroluminescent device 1-1 of the stacked configuration is a top-emitting device in which the light is drawn from the side of the cathode 9 opposite from the substrate 3. Details of each layer in this configuration will now be described, starting from the substrate 3.

Substrate 3

The substrate 3 used for the organic electroluminescent device 1-1 is appropriately selected from a variety of substrates, including a transparent substrate such as glass, a silicon substrate, and a film-like flexible substrate. When the organic electroluminescent device 1-1 is used to make a display device of an active-matrix driving scheme, a TFT substrate including a TFT for each pixel is used as the substrate 3.

Anode 5

The anode 5 provided as a lower electrode on the substrate 3 is made of inorganic material, for which materials having a large work function with respect to the vacuum level is selected so that the holes can be efficiently injected into the organic emission functional layer 7. Examples of such electrode materials include chromium (Cr), gold (Au), an alloy of tin oxide ($SnO_2$) and antimony (Sb), an alloy of zinc oxide (ZnO) and aluminum (Al), a silver (Ag) alloy, and oxides of these metals and alloys. These may be used alone or in combination.

When the organic electroluminescent device 1-1 is a top-emitting device, the efficiency of drawing light to outside can be improved by the interference and high-reflectance effects which can be obtained by using a high-reflectance material for the anode 5. Preferably, such electrode materials contain elements, for example, such as Al and Ag, as the primary component. A transparent electrode material layer having a large work function, for example, such as ITO, may be formed on the high-reflectance material layer to improve carrier injection efficiency.

Other materials also can be used for the anode 5 as long as holes can be injected into the organic emission functional layer 7. For example, an alloy of Mg and Ag can be used.

When the organic electroluminescent device 1-1 is used to make a display device of an active-matrix driving scheme, the anode 5 provided as a lower electrode is patterned for each pixel provided with a TFT. The top layer of the anode 5 is provided with an insulating film (not illustrated), and the surface of the anode 5 of each pixel is exposed through apertures of the insulating film.

Organic Emission Functional Layer 7

The organic emission functional layer 7 formed on the anode 5 includes at least an organic emissive layer 7b, and may optionally include additional layers stacked as required. Here, as an example, the organic emission functional layer 7 includes a hole transport layer 7a and the organic emissive layer 7b stacked in this order from the anode 5 side.

The hole transport layer 7a is provided to improve injection efficiency of the holes into the organic emissive layer 7b. The hole transport layer 7a may be formed of common hole transport materials. Examples include benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene, and derivatives thereof. Other examples include monomers, oligomers, or polymers of heterocyclic conjugate compounds such as polysilane-based compounds, vinyl carbazole-based compounds, thiophene-based compounds, and aniline-based compounds.

When providing a hole injection layer between the anode 5 and the hole transport layer 7a, these materials may be appropriately selected and stacked to provide the hole injection layer and the hole transport layer 7a.

The organic emissive layer 7b is the region where the holes injected from the anode 5 side and the electrons injected from the cathode 9 side recombine under applied voltage to the anode 5 and the cathode 9. In the present embodiment, any conventionally known materials can be used. Examples of such light-emitting materials include polycondensed aromatic compounds; benzooxazole-, benzothiazole-, and benzoimidazole-based fluorescent brighteners; and compounds with good formability into a thin film, such as metal chelate oxanoid compounds, and distyrylbenzene-based compounds. Examples of the polycondensed aromatic compound include a fused-ring light-emitting substance having an anthracene, naphthalene, phenanthrene, pyrene, chrysene, or perylene skeleton; and other fused-ring light-emitting substances having about eight fused-rings. Specific examples include 1,1,4,4-tetraphenyl-1,3-butadiene, and 4,4'-(2,2-diphenylvinyl)biphenyl. The emissive layer may be a single layer of one or more light-emitting materials exemplified above, or a stacked layer of such an emissive layer and another emissive layer of a different compound.

The organic emissive layer 7b may be provided in the organic electroluminescent device 1-1 as a hole transporting emissive layer, an electron transporting emissive layer, or a hole and electron transporting emissive layer. For example, when the organic emissive layer 7b is an electron transporting emissive layer, an aluminum-quinolinol complex (Alq3) may be used.

Note that an electron transport layer or an electron injection layer may be interposed between the organic emissive layer 7b and the cathode 9, as required.

Cathode 9

The cathode 9 may be made of any material as long as it has a small work function in the layer in contact with the organic emission functional layer 7, and good optical transparency. As an example of such a configuration, the cathode 9 has a stacked structure of a first layer and a second layer, formed in this order from the organic emission functional layer 7 side.

The first layer is formed of a material having a small work function and good optical transparency. Examples of such materials include alkali metal oxides, alkali metal fluorides, alkali earth metal oxides, and alkali earth metal fluorides, such as $Li_2O$, $Cs_2CO_3$, $Cs_2SO_4$, MgF, LiF, and $CaF_2$.

The second layer is formed of a material having optical transparency and good conductivity, such as a thin-film Mg—Ag electrode or Ca electrode. When the organic electroluminescent device 1-1 is a top-emitting device of a resonator configuration in which the emitted light is drawn by resonating it between the anode 5 and the cathode 9, the second layer is formed using a semitransparent reflecting material, for example, such as Mg—Ag, and the emitted light is resonated between the second layer and the anode 5. In this case, the film thickness between the second layer and the anode 5 is adjusted according to the resonating wavelength.

Organic Electrode Film 11

The organic electrode film 11 is a characteristic of an embodiment of the present invention. The organic electrode film 11 is configured using at least one of a combination of (1) a polycyclic aromatic hydrocarbon compound and (2) a benzoimidazole derivative, and (3) an azatriphenylene derivative.

When using (1) the polycyclic hydrocarbon compound and (2) the benzoimidazole derivative, the organic electrode film 11 is formed by stacking a layer 11a of (1) the polycyclic aromatic hydrocarbon compound, and a layer 11b of (2) the benzoimidazole derivative. Preferably, the layer 11a of (1) the polycyclic aromatic hydrocarbon compound, and the layer 11b of (2) the benzoimidazole derivative are stacked in this order from the cathode 9 side. This enables electron movement from the layer 11b of (2) the benzoimidazole derivative to the layer 11a of (1) the polycyclic aromatic hydrocarbon compound.

When the organic electrode film 11 is formed using (3) the azatriphenylene derivative, it is preferable to dope a layer of (3) the azatriphenylene derivative with (4) an amine-based material.

Further, the organic electrode film 11 may be configured to include a layer of (3) the azatriphenylene derivative stacked on the layer 11a of (1) the polycyclic aromatic hydrocarbon compound, and the layer 11b of (2) the benzoimidazole derivative. In this case, the stacked position of the layer of (3) the azatriphenylene derivative is not limited.

Specific examples of (1) the polycyclic aromatic hydrocarbon compound, (2) the benzoimidazole derivative, (3) the azatriphenylene derivative, and (4) the amine-based material of the organic electrode film 11 are described below.

(1) The polycyclic aromatic hydrocarbon compound has a backbone of 3- to 7-membered rings. The backbone is selected from anthracene, pyrene, benzopyrene, chrysene, naphthacene, benzonaphthacene, dibenzonaphthacene, perylene, and coronene. It is particularly preferable that an anthracene derivative having the anthracene backbone represented by general formula (1) below be used as the host material.

general formula (1)

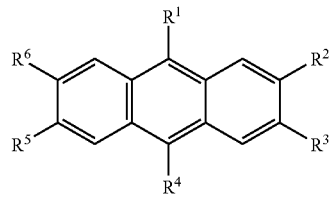

In general formula (1), $R^1$ to $R^6$ each independently represent hydrogen, halogen, a hydroxyl group, an optionally substituted carbonyl group of 20 or less carbon atoms, an optionally substituted carbonyl ester group of 20 or less carbon atoms, an optionally substituted alkyl group of 20 or less carbon atoms, an optionally substituted alkenyl group of 20 or less carbon atoms, an optionally substituted alkoxyl group of 20 or less carbon atoms, a cyano group, a nitro group, an optionally substituted silyl group of 30 or less carbon atoms, an optionally substituted aryl group of 30 or less carbon atoms, an optionally substituted heterocyclic group of 30 or less carbon atoms, or an optionally substituted amino group of 30 or less carbon atoms. Note that the number of carbon atoms includes the carbon atoms of the substituents in the optionally substituted groups.

Examples of the aryl group represented by $R^1$ to $R^6$ in general formula (1) include a phenyl group, a 1-naphthyl group, a 2-naphthyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-chrysenyl group, a 6-chrysenyl group, a 2-fluoranthenyl group, a 3-fluoranthenyl group, a 2-biphenylyl group, a 3-biphenylyl group, a 4-biphenylyl group, an o-tolyl group, a m-tolyl group, a p-tolyl group, and a p-t-butylphenyl group.

Examples of the heterocyclic group represented by $R^1$ to $R^6$ include an aromatic heterocyclic group of a five- or six-membered ring with O, N, or S as the hetero atom, and a fused polycyclic aromatic heterocyclic group of 3 to 20 carbon atoms. Examples of such aromatic heterocyclic group and fused polycyclic aromatic heterocyclic group include a thienyl group, a furyl group, a pyrrolyl group, a pyridyl group, a quinolyl group, a quinoxalyl group, an imidazopyridyl group, and a benzothiazole group. Representative examples include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenathridinyl group, a 2-phenathridinyl group, a 3-phenathridinyl group, a 4-phenathridinyl group, a 6-phenathridinyl group, a 7-phenathridinyl group, an 8-phenathridinyl group, a 9-phenathridinyl group, a 10-phenathridinyl group, a 1-acridinyl group, a 2-acridinyl group, a 3-acridinyl group, a 4-acridinyl group, and a 9-acridinyl group.

The amino group represented by $R^1$ to $R^6$ may be, for example, any of alkylamino group, arylamino group, and aralkylamino group. Preferably, such amino groups include at least one of an aliphatic having a total of 1 to 6 carbon atoms, and a 1 to 4 aromatic carbon rings. Examples of such groups include a dimethylamino group, a diethylamino group, a dibutylamino group, a diphenylamino group, a ditolylamino group, a bis(biphenylylamino) group, and a dinaphthylamino group.

Two or more of the foregoing substituents may form fused-rings, or may include a substituent.

Specific examples of the anthracene derivative suited as the host material are presented by the structural formulae (1)-1 to (1-28 below.

(1)-1

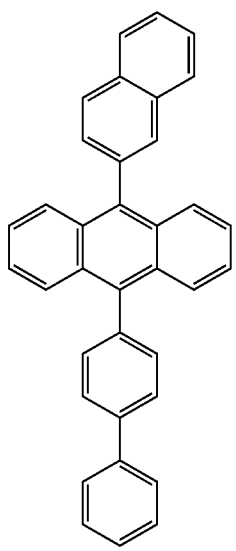

(1)-2

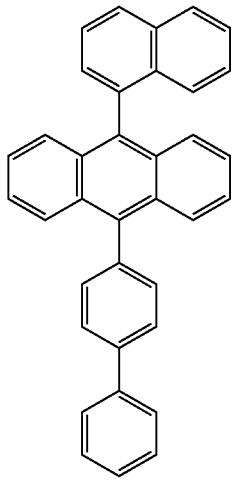

(1)-3

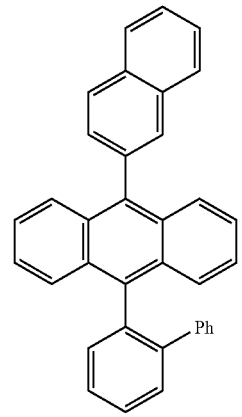

(1)-4

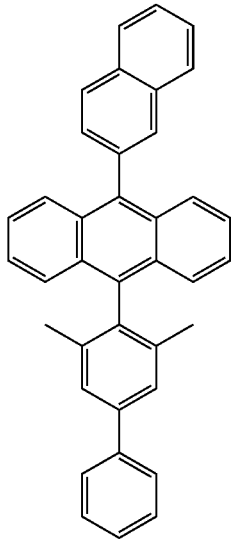

(1)-5
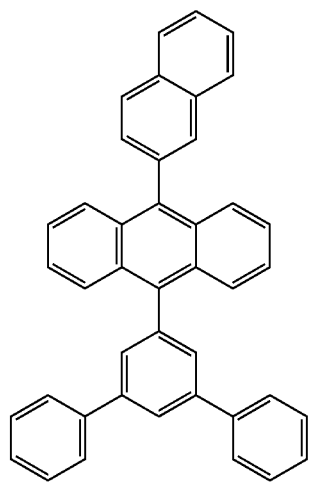
(1)-6
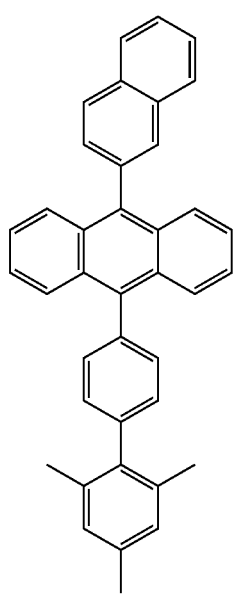
(1)-7
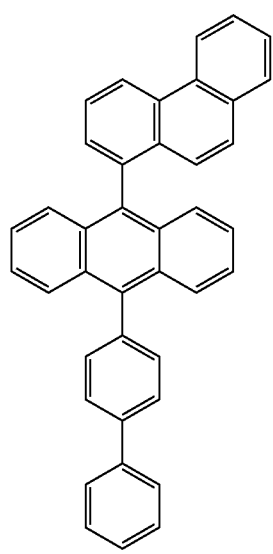
(1)-8
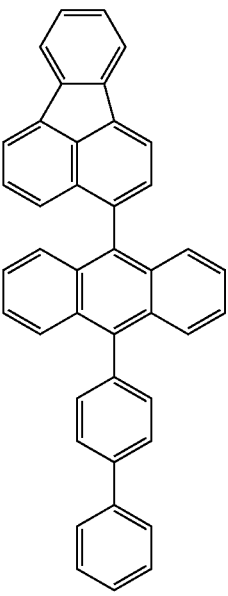
(1)-9
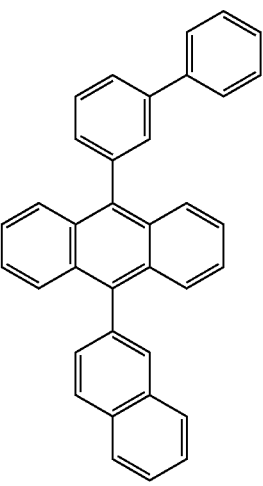
(1)-10
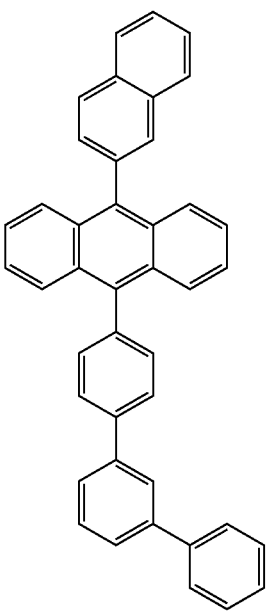

(1)-11
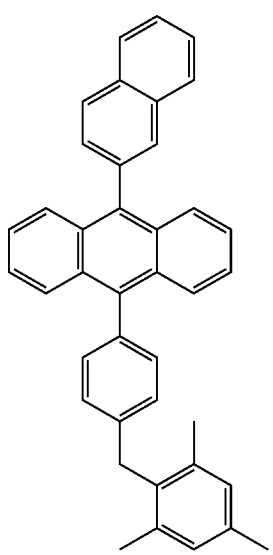
(1)-14
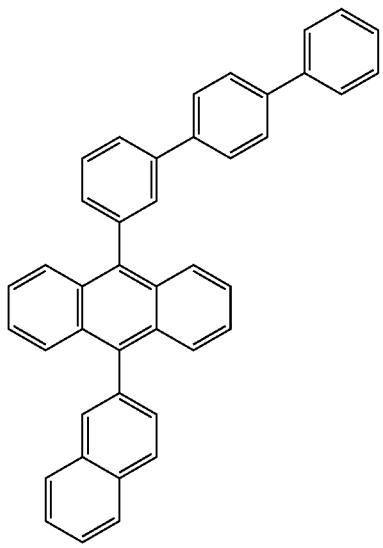
(1)-12
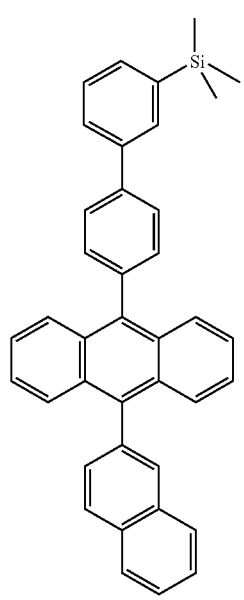
(1)-15
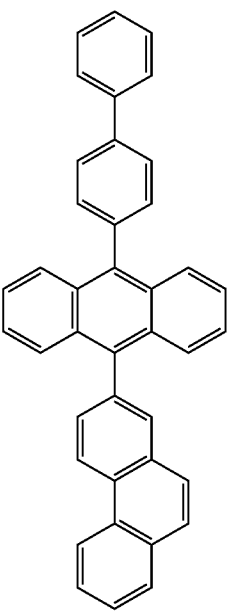
(1)-13
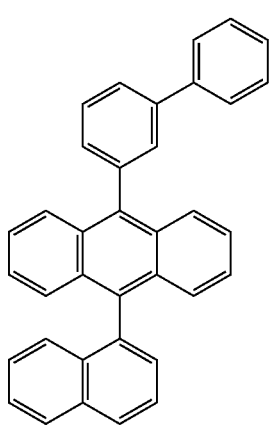
(1)-16
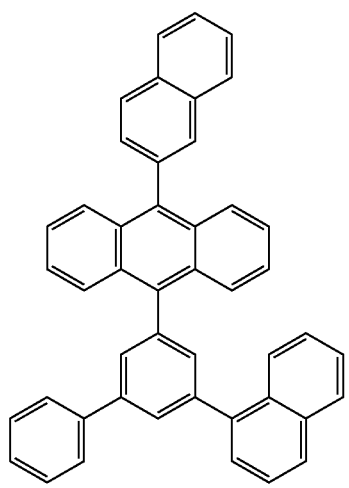

-continued
(1)-17
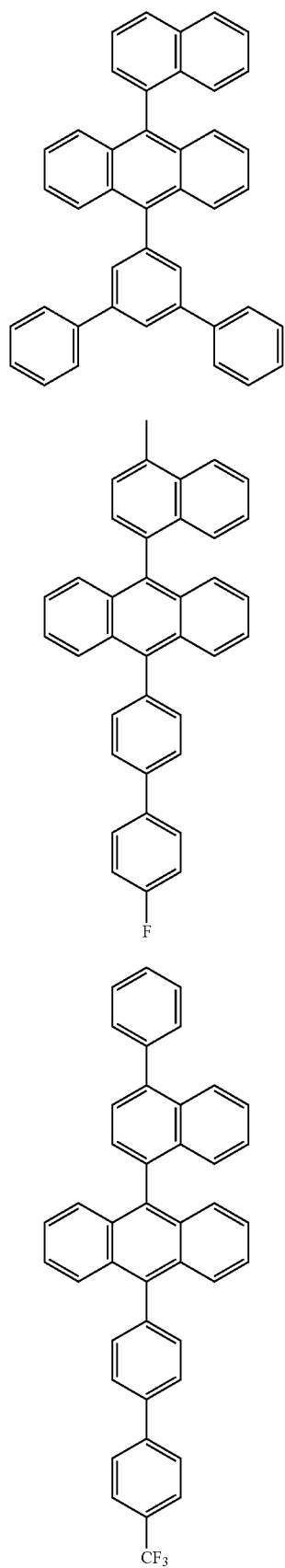
(1)-18
(1)-19
-continued
(1)-20
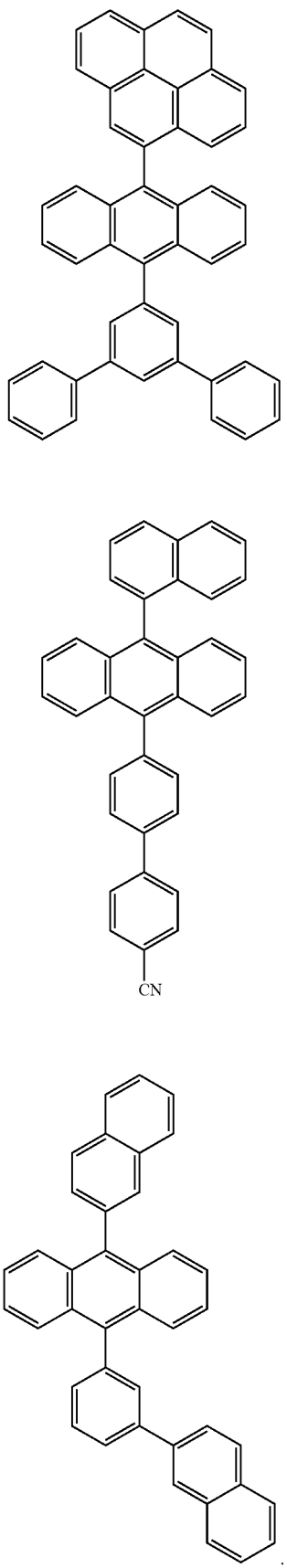
(1)-21
(1)-22

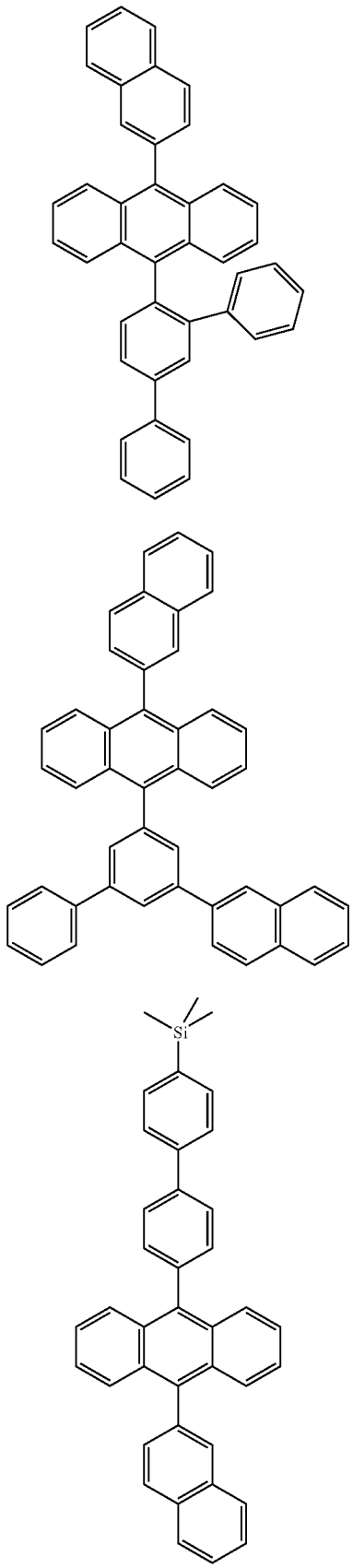
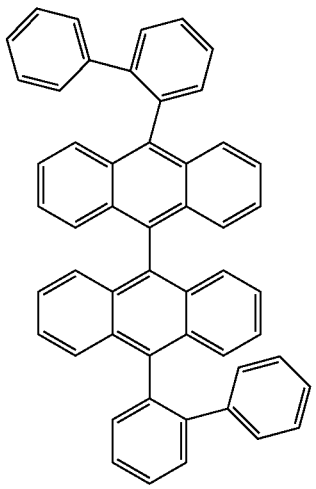
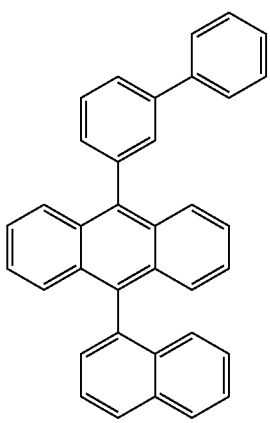
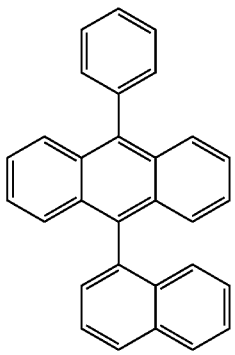
(2) The benzoimidazole derivative is a compound with a substituent in the benzene ring, represented by the following general formula (2).
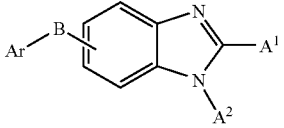
In general formula (2), $A^1$ and $A^2$ each independently represent a hydrogen atom, an optionally substituted aryl group of 60 or less carbon atoms, an optionally substituted heterocyclic group, an optionally substituted alkyl group of 1 to 20 carbon atoms, or an optionally substituted alkoxy group of 1 to 20 carbon atoms.

B in general formula (2) represents an optionally substituted arylene group of 60 or less carbon atoms, an optionally substituted pyridinylene group, an optionally substituted quinolinylene group, or an optionally substituted fluorenylene group.

Ar in general formula (2) represents an optionally substituted aryl group of 6 to 60 carbon atoms, an optionally substituted heterocyclic group of 3 to 60 carbon atoms, an optionally substituted alkyl group of 1 to 20 carbon atoms, or an optionally substituted alkoxy group of 1 to 20 carbon atoms.

Specific examples of the benzoimidazole derivative represented by general formula (2) are presented by the structural formulae (2)-1 to (2)-48 of Tables 1-1 to 1-6, and the structural formulae (2)-49 to (2)-59 below. In Tables 1-1 to 1-6, Ar(α) represents the [benzoimidazole structure+$A^1$+$A^2$] of general formula (2).

TABLE 1-1

TABLE 1-1-continued
| | Ar(α) | B | Ar(1) | Ar(2) |
|---|---|---|---|---|
| (2)-6 | 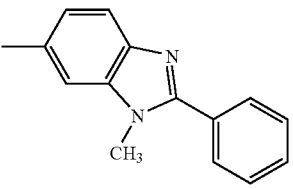 | 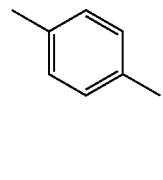 | 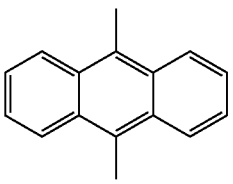 | 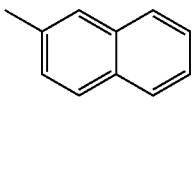 |
| (2)-7 | 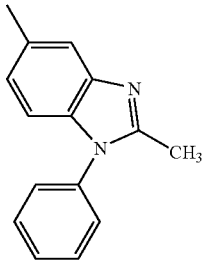 | 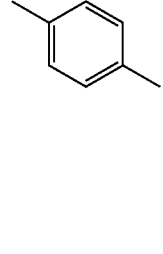 | 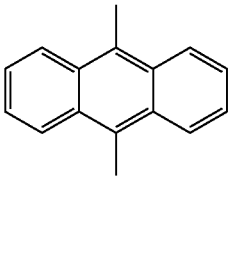 | 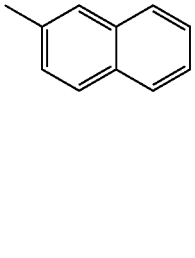 |
| (2)-8 | 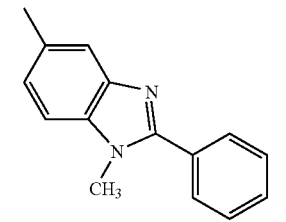 | 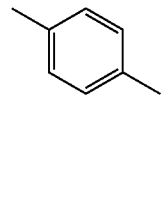 | 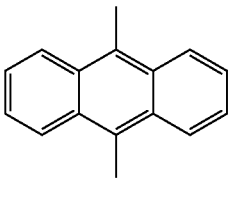 | 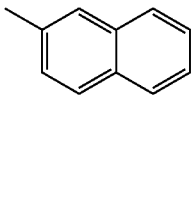 |
| (2)-9 | 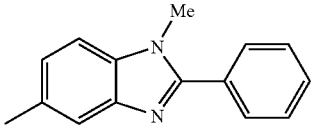 | 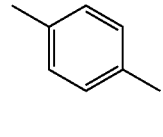 | 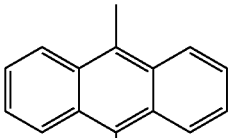 | 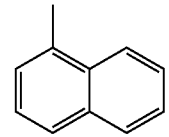 |
| (2)-10 | 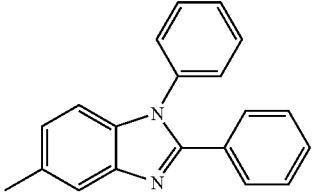 | 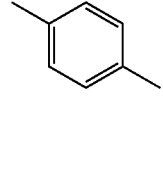 | 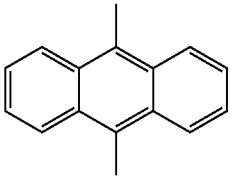 | 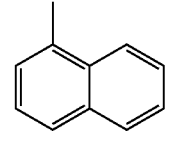 |
TABLE 1-2
| | Ar(α) | B | Ar(1) | Ar(2) |
|---|---|---|---|---|
| (2)-11 | 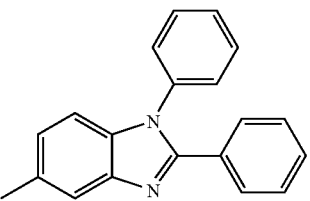 | 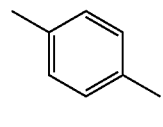 | 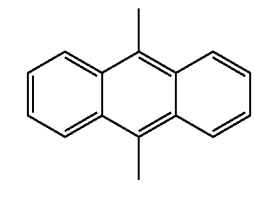 | 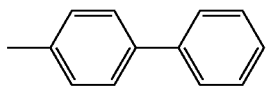 |

TABLE 1-2-continued
| | Ar (α) | B | Ar | |
|---|---|---|---|---|
| | | | Ar (1) | Ar (2) |
| (2)-12 | 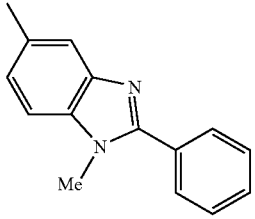 [SMILES: Cc1ccc2c(c1)nc(-c1ccccc1)n2C] | 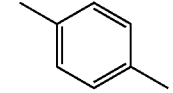 | 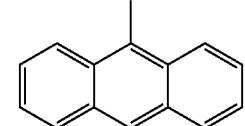 | 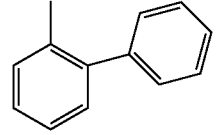 |
| (2)-13 | 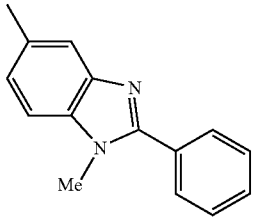 [SMILES: Cc1ccc2c(c1)nc(-c1ccccc1)n2C] | 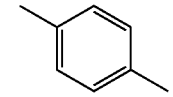 | 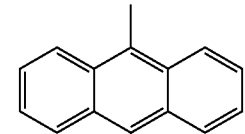 | 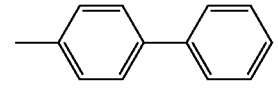 |
| (2)-14 | 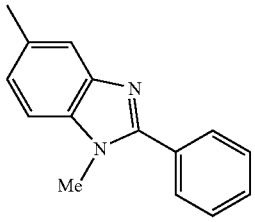 [SMILES: Cc1ccc2c(c1)nc(-c1ccccc1)n2C] | 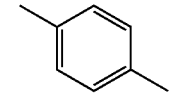 | 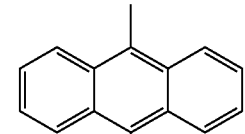 | 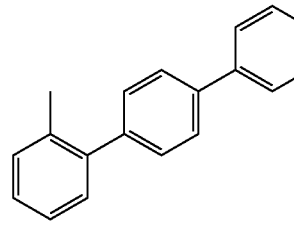 |
| (2)-15 | 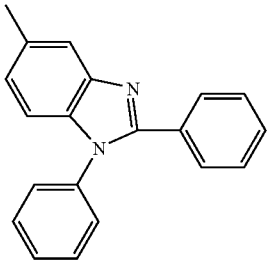 [SMILES: Cc1ccc2c(c1)nc(-c1ccccc1)n2-c1ccccc1] | 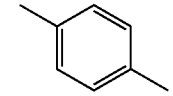 | 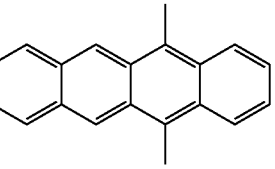 | 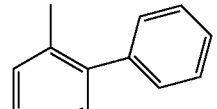 |
| (2)-16 | 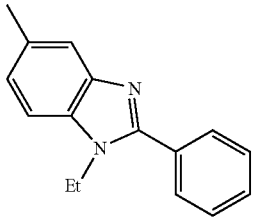 [SMILES: CCn1c(-c2ccccc2)nc2cc(C)ccc21] | 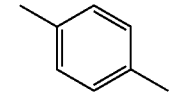 | 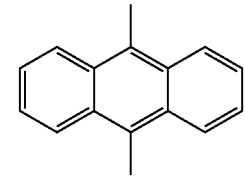 | 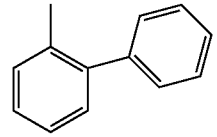 |
| (2)-17 | 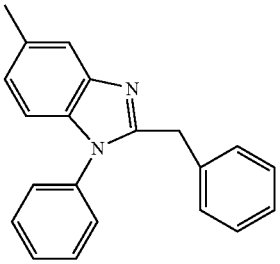 [SMILES: Cc1ccc2c(c1)nc(Cc1ccccc1)n2-c1ccccc1] | 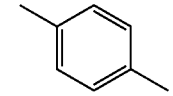 | 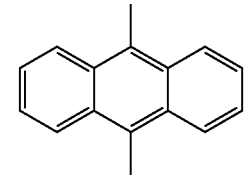 | 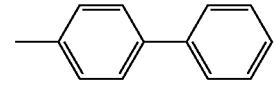 |

TABLE 1-2-continued

| Ar (α) | B | Ar | |
|---|---|---|---|
| | | Ar (1) | Ar (2) |
| (2)-18 [5-methyl-1-methyl-2-(2-pyridyl)benzimidazole] | p-tolyl | 9,10-dimethylanthracene | 2-methyl-4'-phenylbiphenyl |

TABLE 1-3

| Ar (α) | B | Ar | |
|---|---|---|---|
| | | Ar (1) | Ar (2) |
| (2)-19 [5-methyl-1-methyl-2-(4-biphenyl)benzimidazole] | p-tolyl | 9,10-dimethylanthracene | 1-methylnaphthalene |
| (2)-20 [5-methyl-1-methyl-2-(1-naphthyl)benzimidazole] | p-tolyl | 9,10-dimethylanthracene | 1-methylnaphthalene |
| (2)-21 [5-methyl-1-methyl-2-phenylbenzimidazole] | p-tolyl | 9,10-dimethylanthracene | 2-methyl-9,9-dimethylfluorene |
| (2)-22 [5-methyl-1-methyl-2-phenylbenzimidazole] | p-tolyl | 9,10-dimethyl-2-tert-butylanthracene | 2-methylbiphenyl |

TABLE 1-3-continued

| | Ar (α) | B | Ar | |
| --- | --- | --- | --- | --- |
| | | | Ar (1) | Ar (2) |
| (2)-23 | | | | |
| (2)-24 | | | | |

TABLE 1-4

| | Ar (α) | B | Ar |
| --- | --- | --- | --- |
| (2)-25 | | | |
| (2)-26 | | | |
| (2)-27 | | | |

TABLE 1-4-continued

| | Ar (α) | B | Ar |
|---|---|---|---|
| (2)-28 | [benzimidazole with methyl, N-phenyl, 2-phenyl] | [9,10-dimethylanthracene] | [methylnaphthalene] |
| (2)-29 | [benzimidazole with methyl, N-phenyl, 2-CH₃] | [9,10-dimethylanthracene] | [methylnaphthalene] |
| (2)-30 | [benzimidazole with methyl, N-CH₃, 2-phenyl] | [9,10-dimethylanthracene] | [methylnaphthalene] |
| (2)-31 | [benzimidazole with methyl, N-phenyl, 2-CH₃] | [9,10-dimethylanthracene] | [methylnaphthalene] |
| (2)-32 | [benzimidazole with methyl, N-CH₃, 2-phenyl] | [9,10-dimethylanthracene] | [methylnaphthalene] |

TABLE 1-5

| | Ar (α) | B | Ar |
|---|---|---|---|
| (2)-33 | [benzimidazole with methyl, N-phenyl, 2-(2-pyridyl)] | [9,10-dimethylanthracene] | [methylnaphthalene] |

TABLE 1-5-continued

| | Ar (α) | B | Ar |
|---|---|---|---|
| (2)-34 | 5-methyl-1-phenyl-2-(pyridin-2-yl)-1H-benzimidazole | 9,10-dimethylanthracene | 2-methylnaphthalene |
| (2)-35 | 6-methyl-1-phenyl-2-(pyridin-3-yl)-1H-benzimidazole | 9,10-dimethylanthracene | 2-methylnaphthalene |
| (2)-36 | 5-methyl-1-phenyl-2-(pyridin-3-yl)-1H-benzimidazole | 9,10-dimethylanthracene | 2-methylnaphthalene |
| (2)-37 | 6-methyl-1-phenyl-2-(pyridin-4-yl)-1H-benzimidazole | 9,10-dimethylanthracene | 2-methylnaphthalene |
| (2)-38 | 5-methyl-1-phenyl-2-(pyridin-4-yl)-1H-benzimidazole | 9,10-dimethylanthracene | 2-methylnaphthalene |
| (2)-39 | 1,2,5-trimethyl-1H-benzimidazole | 9,10-dimethylanthracene | 2-methylnaphthalene |

TABLE 1-5-continued

| | Ar (α) | B | Ar |
|---|---|---|---|
| (2)-40 | 5,6-dimethyl-1-methyl-2-methyl benzimidazole (with N-CH₃ and 2-CH₃) | 9,10-dimethylanthracene | 2-methylnaphthalene |

TABLE 1-6

| | Ar (α) | B | Ar |
|---|---|---|---|
| (2)-41 | 5-methyl-2-phenyl-1-(pyridin-2-yl)benzimidazole | 9,10-dimethylanthracene | 2-methylnaphthalene |
| (2)-42 | 5-methyl-2-phenyl-1-(pyridin-2-yl)benzimidazole (isomer) | 9,10-dimethylanthracene | 2-methylnaphthalene |
| (2)-43 | 5-methyl-2-phenyl-1-(pyridin-3-yl)benzimidazole | 9,10-dimethylanthracene | 2-methylnaphthalene |
| (2)-44 | 5-methyl-2-phenyl-1-(pyridin-3-yl)benzimidazole (isomer) | 9,10-dimethylanthracene | 2-methylnaphthalene |
| (2)-45 | 5-methyl-2-phenyl-1-(pyridin-4-yl)benzimidazole | 9,10-dimethylanthracene | 2-methylnaphthalene |

TABLE 1-6-continued
| | Ar (α) | B | Ar |
|---|---|---|---|
| (2)-46 | 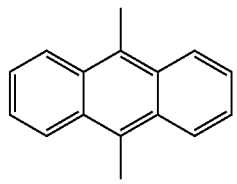 [SMILES: Cc1c2ccccc2c(C)c2ccccc12] | 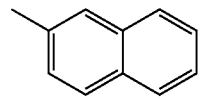 | 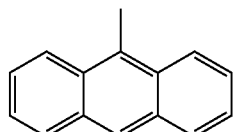 |
| (2)-47 | 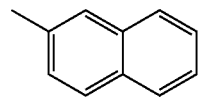 | | |
| (2)-48 | 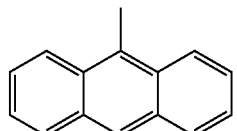 | 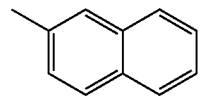 | |
(2)-49
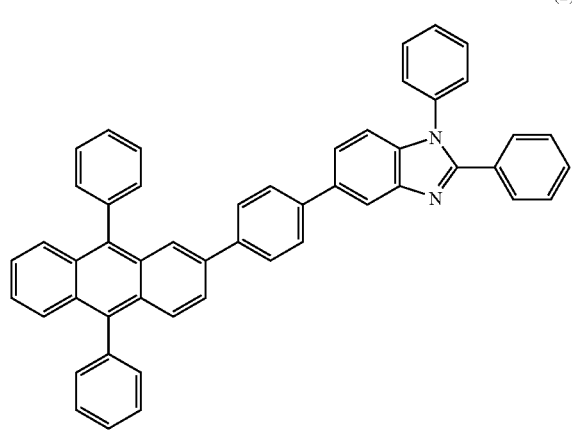
(2)-50
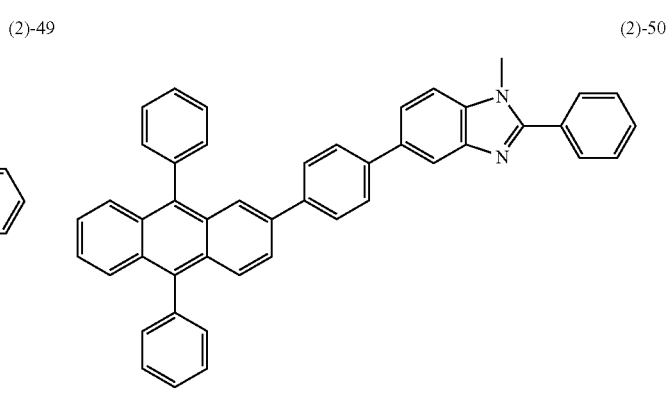

-continued
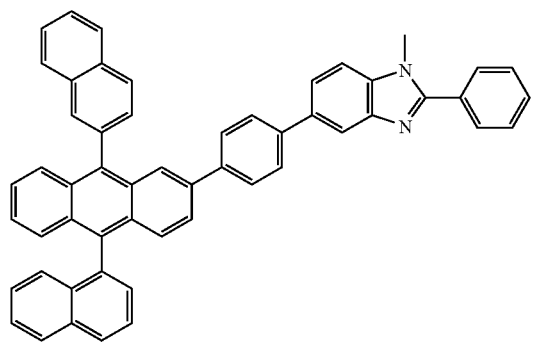
(2)-51
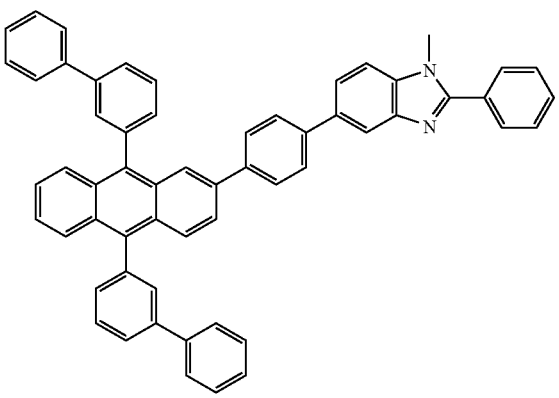
(2)-52
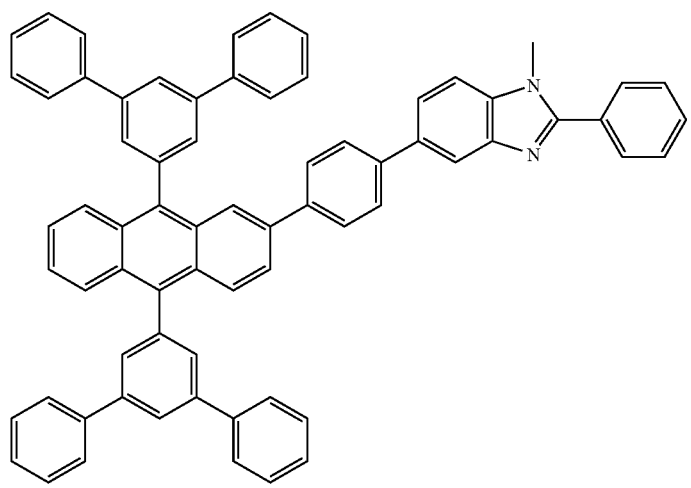
(2)-53
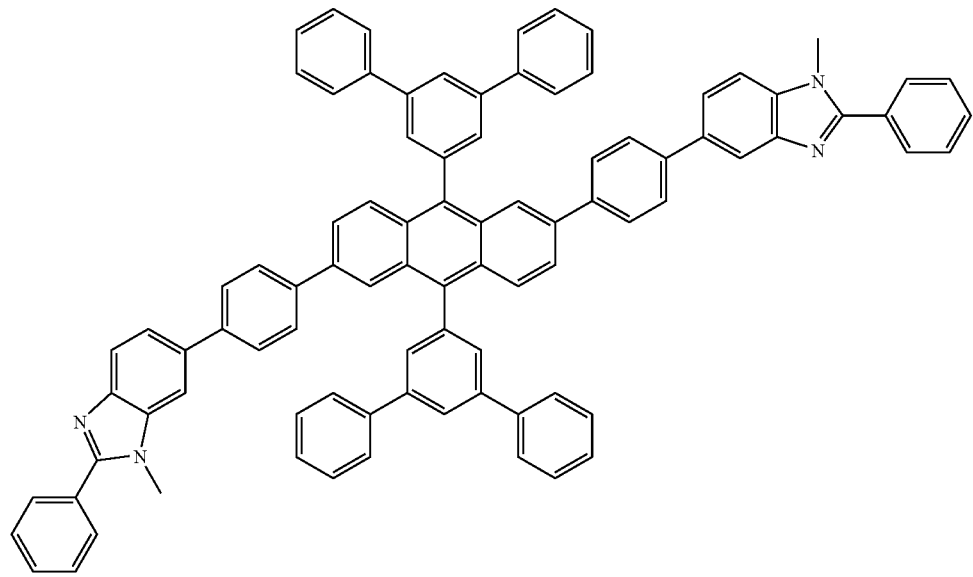
(2)-54

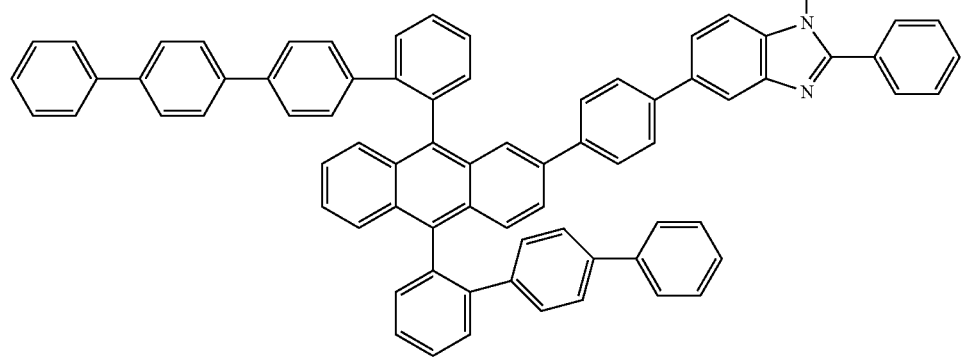
(2)-55
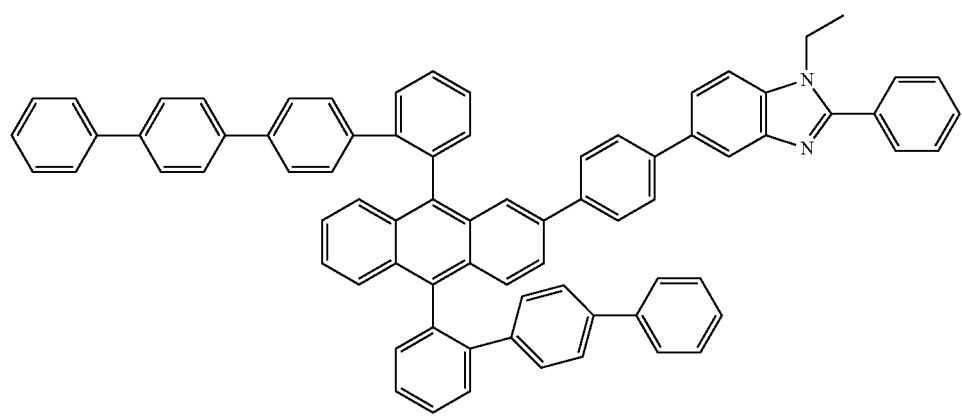
(2)-56
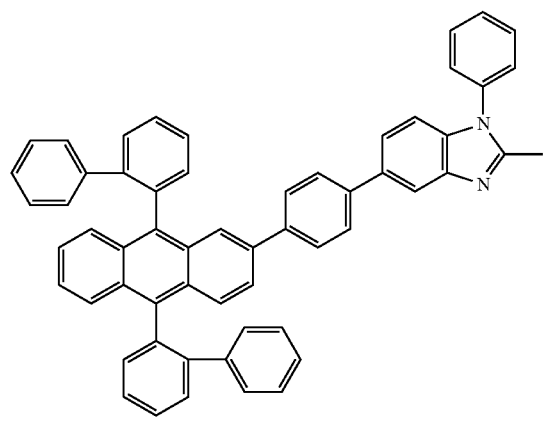
(2)-57
(2)-58

(2)-59

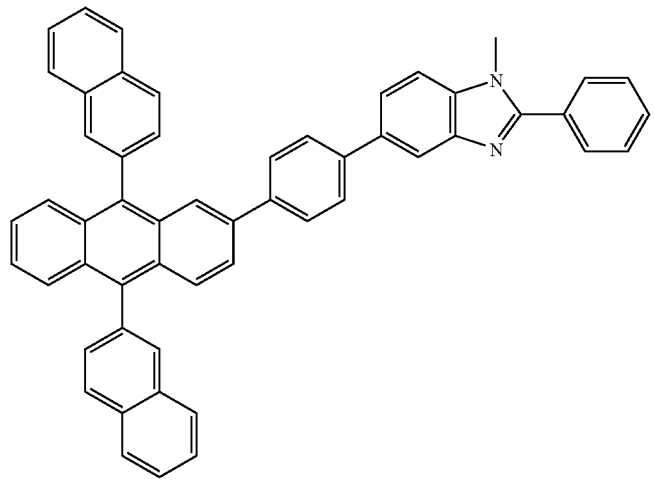

(3) The azatriphenylene derivative is the compound represented by the following general formula (3).

general formula (3)

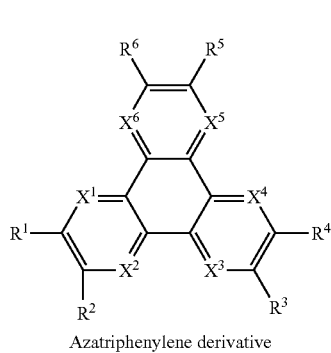

Azatriphenylene derivative

In the azatriphenylene derivative represented by general formula (3), $R^1$ to $R^6$ in the formula each independently represent a substituent selected from hydrogen, halogen, a hydroxyl group, an amino group, an arylamino group, a substituted or unsubstituted carbonyl group of 20 or less carbon atoms, a substituted or unsubstituted carbonyl ester group of 20 or less carbon atoms, a substituted or unsubstituted alkyl group of 20 or less carbon atoms, a substituted or unsubstituted alkenyl group of 20 or less carbon atoms, a substituted or unsubstituted alkoxyl group of 20 or less carbon atoms, a substituted or unsubstituted aryl group of 30 or less carbon atoms, a substituted or unsubstituted heterocyclic group of 30 or less carbon atoms, a nitrile group, a cyano group, a nitro group, and a silyl group. The adjacent $R^m$ (m=1 to 6) may be bonded to each other via a cyclic structure. $X^1$ to $X^6$ in general formula (3) each independently represent a carbon or nitrogen (N) atom. The compound is particularly suitable for the hole injection layer 14a when X is a nitrogen atom and thus raises the nitrogen content of the compound.

A specific examples of the azatriphenylene derivative is the hexanitrile azatriphenylene represented by the following structural formula (3)-1.

(3)-1

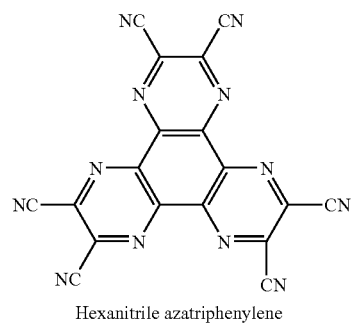

Hexanitrile azatriphenylene (4) The amine-based material is selected from low-molecular families of the materials commonly used for organic electroluminescent devices, for example, such as α-NPD. Other than these, m-MTDATA can be used.

Cathode Wire 13

It is important that the cathode wire 13 be made of high conductive material and have good optical transparency. The cathode wire 13 may be formed using the same material as, for example, the cathode 9. The entire stacked structure of the cathode 9 and the organic electrode film 11 materially forms the cathode. The voltage that causes the organic electroluminescent device 1-1 to emit light may be applied to the cathode wire 13 and the anode 5. In a display device including a plurality of organic electroluminescent devices 1-1 arrayed on a substrate, a negative voltage may be applied to both the cathode wire 13 and the cathode 9, when the influence of voltage drop at the central portion of the display region is not of concern.

When the organic electroluminescent device 1-1 is used to make a display device of an active-matrix driving scheme, the upper electrode cathode 9, the organic electrode film 11, and the cathode wire 13 may be provided in the form of a solid film as a common electrode for the organic electroluminescent device 1-1 provided for each pixel. Here, it is important that the organic electrode film 11 be securely placed between the cathode 9 and the cathode wire 13 to prevent direct contact between the cathode 9 and the cathode wire 13.

In the organic electroluminescent device 1-1 configured as above, the organic electrode film 11 provided in contact with the outer side of the cathode 9 is formed using a low molecular material. This ensures improved productivity because the low molecular material enables vapor deposition of the organic electrode film 11 at a faster rate than polymer materials. Further, because the organic electrode film 11 formed of such material is sufficiently conductive, the conductivity of the cathode 9 provided in contact with the organic electrode film 11 can be complemented. Thus, a decrease in conductivity caused by reducing the thickness of the cathode 9 or the cathode wire 13 of inorganic material in an effort to draw light from the cathode 9 side can be sufficiently complemented by the organic electrode film 11. This enables low-voltage driving of the organic electroluminescent device 1-1 provided with the organic electrode film 11, and thus improves emission efficiency, as will be described later in the Example section.

<2. Second Embodiment>

Figure 2:
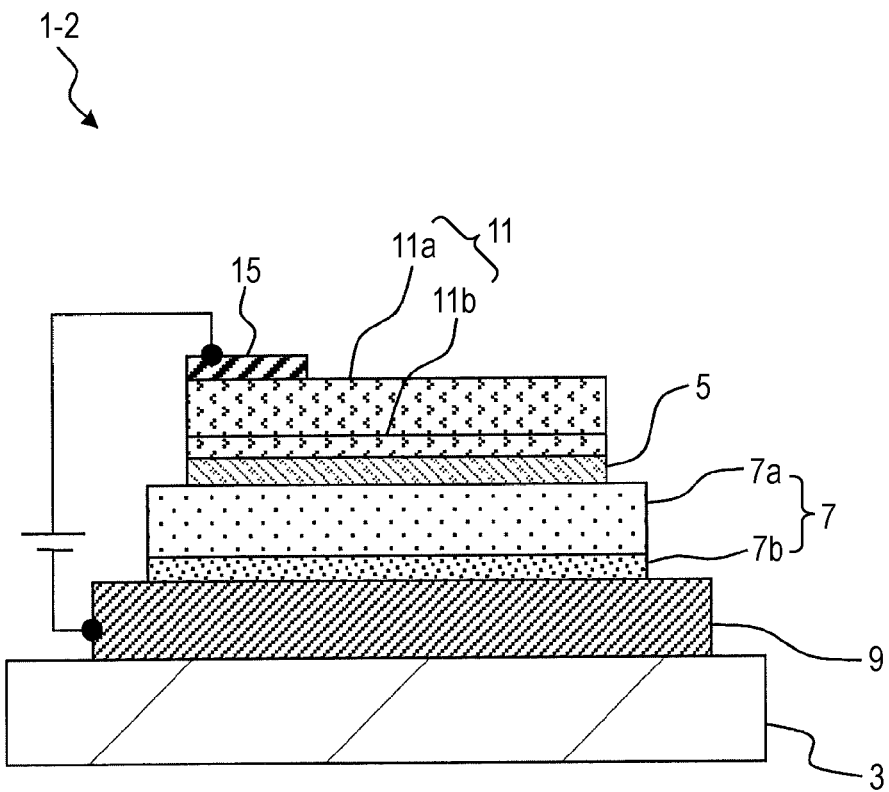
FIG. 2 is a cross sectional view of an organic electroluminescent device according to a Second Embodiment.

FIG. 2 is a cross sectional view schematically illustrating an organic electroluminescent device 1-2 according to another embodiment of the present invention. The organic electroluminescent device 1-2 is a second example suited for top emission, and differs from the First Embodiment in the order of stacking; namely, it has a reverse stacked configuration in which the cathode 9 and the anode 5 are used as the lower and upper electrodes, respectively. Note that each layer of the organic electroluminescent device 1-2 will be described with reference to the same reference numerals used in the First Embodiment, and no detailed descriptions will be given concerning the materials of these layers because the same materials are used as in the First Embodiment.

Specifically, the organic electroluminescent device 1-2 includes a cathode 9 provided as a lower electrode on a substrate 3, an organic emission functional layer 7 overlaid on the cathode 9, and an anode 5 provided as an upper electrode on the organic emission functional layer 7. An organic electrode film 11 and an anode wire 15 are provided on the anode 5. The organic electrode film 11 is formed using the materials described above.

In this manner, the order of stacking between the cathode 9 and the anode 5 on the substrate 3 is the reverse of that described in the First Embodiment, and accordingly the order of stacking in the stacked structure of each layer is also the reverse of that described in the First Embodiment.

Taking the organic emission functional layer 7 as an example, the organic emissive layer 7b and the hole transport layer 7a are stacked in this order from the cathode 9 side.

The organic electrode film 11, a characteristic of an embodiment of the present invention, does not differ from the First Embodiment It is formed by using at least one of a combination of (1) a polycyclic aromatic hydrocarbon compound and (2) a benzoimidazole derivative, and (3) an azatriphenylene derivative.

However, the order of stacking between the layer 11a of (1) the polycyclic aromatic hydrocarbon compound and the layer 11b of (2) the benzoimidazole derivative in the organic electrode film 11 is preferably the layer 11b of (2) the benzoimidazole derivative and the layer 11a of (1) the polycyclic aromatic hydrocarbon compound from the anode 5 side. This enables electron movement from the layer 11b of (2) the benzoimidazole derivative to the layer 11a of (1) the polycyclic aromatic hydrocarbon compound.

When the organic electrode film 11 is formed using (3) the azatriphenylene derivative, it is preferable to dope the layer of (3) the azatriphenylene derivative with (4) the amine-based material. Further, the organic electrode film 11 may be configured to include a layer of (3) the azatriphenylene derivative stacked on the layer 11a of (1) the polycyclic aromatic hydrocarbon compound, and the layer 11b of (2) the benzoimidazole derivative. In this case, the stacked position of the layer of (3) the azatriphenylene derivative is not limited. This is also the same as in the First Embodiment.

It is important that the anode wire 15 formed on the organic electrode film 11 be made of high conductive material and have good optical transparency. The anode wire 15 may be formed using the same material as, for example, the anode 5. The entire stacked structure of the anode 5, the organic electrode film 11, and the anode wire 15 materially forms the anode. The voltage that causes the organic electroluminescent device 1-2 to emit light may be applied to the anode wire 15 and the cathode 9. In a display device including a plurality of organic electroluminescent devices 1-2 arrayed on a substrate, a positive voltage may be applied to both the anode wire 15 and the anode 5, when the influence of voltage drop at the central portion of the display region is not of concern.

When the organic electroluminescent device 1-2 is used to make a display device of an active-matrix driving scheme, the lower electrode cathode 9 is patterned for each pixel provided with a TFT. The top layer of the cathode 9 is provided with an insulating film (not illustrated), and the surface of the cathode 9 of each pixel is exposed through apertures of the insulating film. The upper electrode anode 5, the organic electrode film 11, and the anode wire 15 may be provided in the form of a solid film as a common electrode for the organic electroluminescent device 1-2 provided for each pixel. Here, it is important that the organic electrode film 11 be securely placed between the anode 5 and the anode wire 15 to prevent direct contact between the anode 5 and the anode wire 15.

In the organic electroluminescent device 1-2 configured as above, the organic electrode film 11 provided in contact with the outer side of the anode 5 is formed using a low molecular material. This ensures improved productivity because the low molecular material enables vapor deposition of the organic electrode film 11 at a faster rate than polymer materials. Further, because the organic electrode film 11 formed of such material is sufficiently conductive, the conductivity of the anode 5 provided in contact with the organic electrode film 11 can be complemented. Thus, a decrease in conductivity caused by reducing the thickness of the anode 5 or the anode wire 15 of inorganic material in an effort to draw light from the anode 5 side can be sufficiently complemented by the organic electrode film 11. This enables low-voltage driving of the organic electroluminescent device 1-2 provided with the organic electrode film 11, and thus improves emission efficiency, as will be described later in the Example section.

<3. Third Embodiment>

Figure 3:
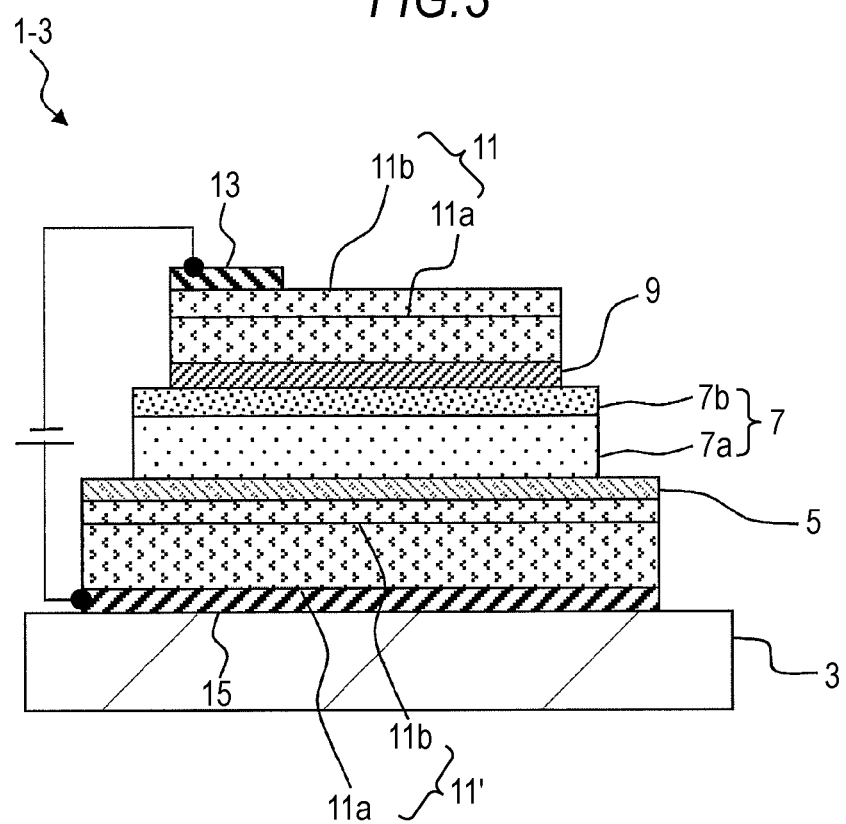
FIG. 3 is a cross sectional view of an organic electroluminescent device according to a Third Embodiment.

FIG. 3 is a cross sectional view schematically illustrating an organic electroluminescent device 1-3 according to another embodiment of the present invention. The organic electroluminescent device 1-3 is a first example suited for top-and-bottom emission, and additionally includes an organic electrode film 11' on the lower electrode anode 5 side in the configuration of the First Embodiment. Note that each layer of the organic electroluminescent device 1-3 will be described with reference to the same reference numerals used in the First Embodiment, and no detailed descriptions will be given concerning the materials of these layers because the same materials are used as in the First Embodiment.

Specifically, the organic electroluminescent device 1-3 has a stacked configuration in which an anode wire 15 and the organic electrode film 11' are formed on the substrate 3 in this order, and in which the anode 5, the organic emission functional layer 7, the cathode 9, the organic electrode film 11, and the cathode wire 13 described in the First Embodiment are stacked thereon.

It is important that the anode wire 15 be made of high conductive material and have good optical transparency. The anode wire 15 may be formed using the same material as, for example, the anode 5. The entire stacked structure of the anode 5 and the organic electrode film 11' materially forms the anode. The voltage that causes the organic electroluminescent device 1-3 to emit light may be applied to the anode wire 15 and the anode 5.

The organic electrode film 11', a characteristic of the presently described Third Embodiment, is formed by using at least one of a combination of (1) a polycyclic aromatic hydrocarbon compound and (2) a benzoimidazole derivative, and (3) an azatriphenylene derivative, as with the organic electrode film 11 described in other embodiments.

The order of stacking between the layer 11a of (1) the polycyclic aromatic hydrocarbon compound and the layer 11b of (2) the benzoimidazole derivative in the organic electrode film 11' is preferably the layer 11b of (2) the benzoimidazole derivative and the layer 11a of (1) the polycyclic aromatic hydrocarbon compound from the anode 5 side. This enables electron movement from the layer 11b of (2) the benzoimidazole derivative to the layer 11a of (1) the polycyclic aromatic hydrocarbon compound.

When the organic electrode film 11' is formed using (3) the azatriphenylene derivative, it is preferable to dope the layer of (3) the azatriphenylene derivative with (4) the amine-based material. Further, the organic electrode film 11' may be configured to include a layer of (3) the azatriphenylene derivative stacked on the layer 11a of (1) the polycyclic aromatic hydrocarbon compound, and the layer 11b of (2) the benzoimidazole derivative. In this case, the stacked position of the layer of (3) the azatriphenylene derivative is not limited. This is also the same as in the organic electrode film 11 described in other embodiments.

When the organic electroluminescent device 1-3 is used to make a display device of an active-matrix driving scheme, the lower electrode anode 5, the organic electrode film 11', and the anode wire 15 are patterned for each pixel provided with a TFT. Here, it is important that the organic electrode film 11' be securely placed between the anode 5 and the anode wire 15 to prevent direct contact between the anode 5 and the anode wire 15. The upper electrode cathode 9, the organic electrode film 11, and the cathode wire 13 may be provided in the form of a solid film as a common electrode for the organic electroluminescent device 1-3 provided for each pixel. Here, it is important that the organic electrode film 11 be securely placed between the cathode 9 and the cathode wire 13 to prevent direct contact between the cathode 9 and the cathode wire 13. Further, the voltage that causes the organic electroluminescent device 1-3 to emit light may be applied to the cathode wire 13 and the anode wire 15. When there is no influence of voltage drop, the voltage may be applied to the cathode wire 13 and the cathode 9, and to the anode wire 15 and the anode 5.

In the organic electroluminescent device 1-3 configured as above, the organic electrode film 11' provided in contact with the outer side of the anode 5, and the organic electrode film 11 provided in contact with the outer side of the cathode 9 are formed using a low molecular material. This ensures improved productivity because the low molecular material enables vapor deposition of the organic electrode films 11 and 11' at a faster rate than polymer materials. Further, because the organic electrode films 11 and 11' formed of such material are sufficiently conductive, the conductivity of the anode 5 and the cathode 9 provided in contact with the organic electrode films 11 and 11' can be complemented. Thus, a decrease in conductivity caused by reducing the thickness of the anode 5 or the anode wire 15, or the cathode 9 or the cathode wire 13 of inorganic material in an effort to draw light from the anode 5 and cathode 9 side can be sufficiently complemented by the organic electrode films 11 and 11'. This enables low-voltage driving of the organic electroluminescent device 1-3 provided with the organic electrode films 11 and 11', and thus improves emission efficiency, as in the foregoing First and Second Embodiments.

<4. Fourth Embodiment>

Figure 4:
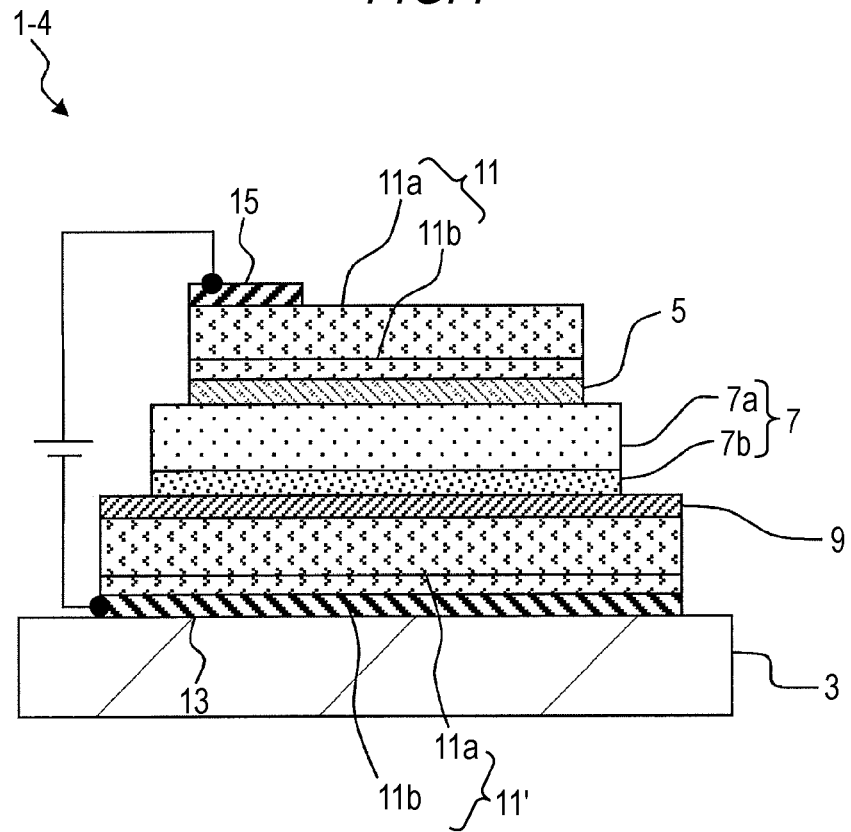
FIG. 4 is a cross sectional view of an organic electroluminescent device according to a Fourth Embodiment.

FIG. 4 is a cross sectional view schematically illustrating an organic electroluminescent device 1-4 according to another embodiment of the present invention. The organic electroluminescent device 1-4 is a second example suited for top-and-bottom emission, and additionally includes an organic electrode film 11' on the lower electrode cathode 9 side in the reverse stacked configuration of the Second Embodiment. Note that each layer of the organic electroluminescent device 1-4 will be described with reference to the same reference numerals used in the First Embodiment, and no detailed descriptions will be given concerning the materials of these layers because the same materials are used as in the First Embodiment.

Specifically, the organic electroluminescent device 1-4 has a stacked configuration in which a cathode wire 13 and the organic electrode film 11' are formed on the substrate 3 in this order, and in which the cathode 9, the organic emission functional layer 7, the anode 5, the organic electrode film 11, and the anode wire 15 described in the Second Embodiment are stacked thereon.

It is important that the cathode wire 13 be made of high conductive material and have good optical transparency. The cathode wire 13 may be formed using the same material as, for example, the cathode 9. The entire stacked structure of the cathode 9 and the organic electrode film 11' materially forms the cathode. The voltage that causes the organic electroluminescent device 1-4 to emit light may be applied to the cathode wire 13 and the cathode 9.

The organic electrode film 11', a characteristic of the presently described Fourth Embodiment, is formed by using at least one of a combination of (1) a polycyclic aromatic hydrocarbon compound and (2) a benzoimidazole derivative, and (3) an azatriphenylene derivative, as with the organic electrode film 11 described in other embodiments.

The order of stacking between the layer 11a of (1) the polycyclic aromatic hydrocarbon compound and the layer 11b of (2) the benzoimidazole derivative in the organic electrode film 11' is preferably the layer 11a of (1) the polycyclic aromatic hydrocarbon compound and the layer 11b of (2) the benzoimidazole derivative and from the cathode 9 side. This enables electron movement from the layer 11b of (2) the benzoimidazole derivative to the layer 11a of (1) the polycyclic aromatic hydrocarbon compound.

When the organic electrode film 11' is formed using (3) the azatriphenylene derivative, it is preferable to dope the layer of (3) the azatriphenylene derivative with (4) the amine-based material. Further, the organic electrode film 11' may be configured to include a layer of (3) the azatriphenylene derivative stacked on the layer 11a of (1) the polycyclic aromatic hydrocarbon compound, and the layer 11b of (2) the benzoimidazole derivative. In this case, the stacked position of the layer of (3) the azatriphenylene derivative is not limited. This is also the same as in the organic electrode film 11 described in other embodiments.

When the organic electroluminescent device 1-4 is used to make a display device of an active-matrix driving scheme, the lower electrode cathode 9, the organic electrode film 11', and the cathode wire 13 are patterned for each pixel provided with a TFT. Here, it is important that the organic electrode film 11' be securely placed between the cathode 9 and the cathode wire 13 to prevent direct contact between the cathode 9 and the cathode wire 13. The upper electrode anode 5, the organic electrode film 11, and the anode wire 15 may be provided in the form of a solid film as a common electrode for the organic electroluminescent device 1-4 provided for each pixel. Here, it is important that the organic electrode film 11 be securely placed between the anode 5 and the anode wire 15 to prevent direct contact between the anode 5 and the anode wire 15. Further, the voltage that causes the organic electroluminescent device 1-4 to emit light may be applied to the cathode wire 13 and the anode wire 15. When there is no influence of voltage drop, the voltage may be applied to the cathode wire 13 and the cathode 9, and to the anode wire 15 and the anode 5.

In the organic electroluminescent device 1-4 configured as above, the organic electrode film 11' provided in contact with the outer side of the anode 5, and the organic electrode film 11 provided in contact with the outer side of the cathode 9 are formed using a low molecular material as in the Third Embodiment. Thus, a decrease in conductivity caused by reducing the thickness of the anode 5 or the anode wire 15, or the cathode 9 or the cathode wire 13 of inorganic material in an effort to draw light from the anode 5 and cathode 9 side can be sufficiently complemented by the organic electrode films 11 and 11'. This enables low-voltage driving of the organic electroluminescent device 1-4 provided with the organic electrode films 11 and 11', and thus improves emission efficiency, as in the other embodiments.

<5. Fifth Embodiment>

Figure 5:
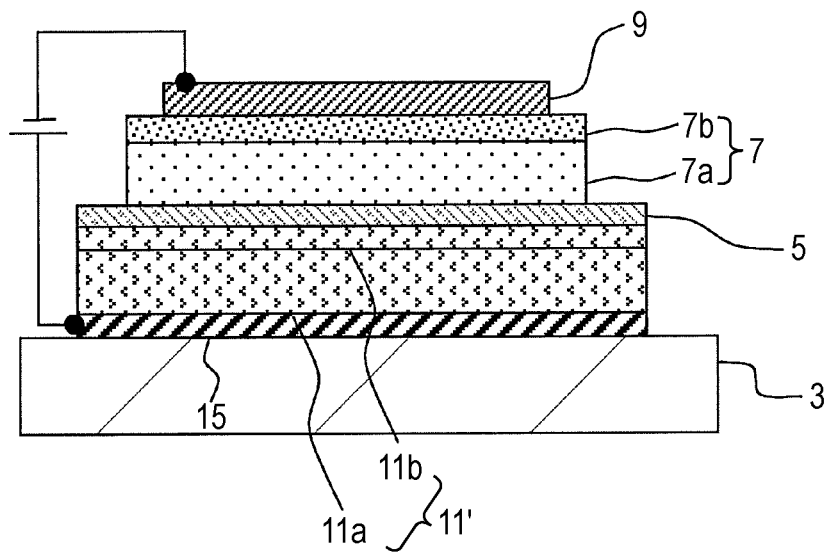
FIG. 5 is a cross sectional view of an organic electroluminescent device according to a Fifth Embodiment.

FIG. 5 is a cross sectional view schematically illustrating an organic electroluminescent device 1-5 according to another embodiment of the present invention. The organic electroluminescent device 1-5 is a first example suited for a transmissive configuration in which light is drawn from the substrate side, and has the structure of the Third Embodiment except that the organic electrode film (11) and the cathode wire (13) on the upper electrode cathode 9 side are removed.

In the organic electroluminescent device 1-5 configured as above, the organic electrode film 11 provided in contact with the outer side of the lower electrode anode 5 is formed using a low molecular material. Thus, a decrease in conductivity caused by reducing the thickness of the anode 5 or the anode wire 15 of inorganic material in an effort to draw light from the anode 5 side through the substrate 3 can be sufficiently complemented by the organic electrode film 11 as in the other embodiments. This enables low-voltage driving of the organic electroluminescent device 1-5 provided with the organic electrode film 11, and thus improves emission efficiency.

<6. Sixth Embodiment>

Figure 6:
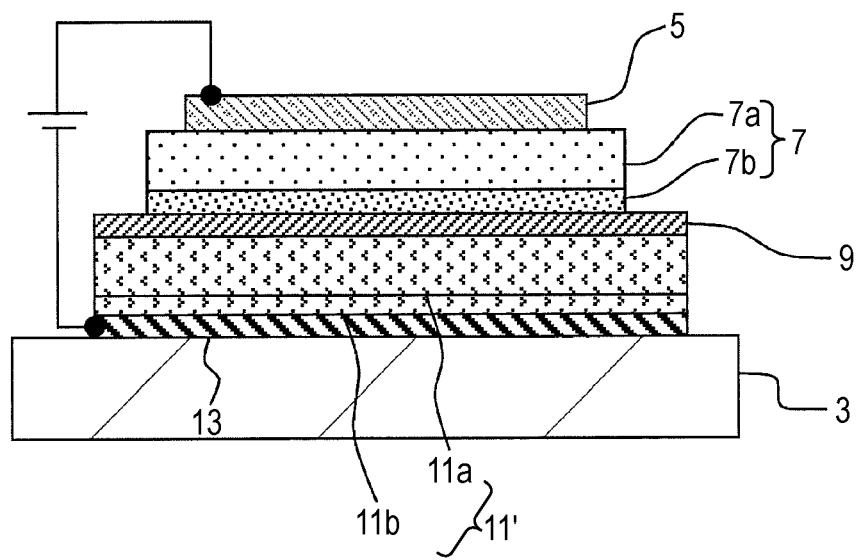
FIG. 6 is a cross sectional view of an organic electroluminescent device according to a Sixth Embodiment.

FIG. 6 is a cross sectional view schematically illustrating an organic electroluminescent device 1-6 according to another embodiment of the present invention. The organic electroluminescent device 1-6 is a second example suited for a transmissive configuration in which light is drawn from the substrate side, and has the structure of the Fourth Embodiment except that the organic electrode film (11) and the anode wire (15) on the upper electrode anode 5 side are removed.

In the organic electroluminescent device 1-6 configured as above, the organic electrode film 11' provided in contact with the outer side of the upper electrode cathode 9 is formed using a low molecular material. Thus, a decrease in conductivity caused by reducing the thickness of the cathode 9 or the cathode wire 13 of inorganic material in an effort to draw light from the cathode 9 side through the substrate 3 can be sufficiently complemented by the organic electrode film 11' as in the other embodiments. This enables low-voltage driving of the organic electroluminescent device 1-6 provided with the organic electrode film 11', and thus improves emission efficiency.

<7. Seventh Embodiment>

Figure 7:
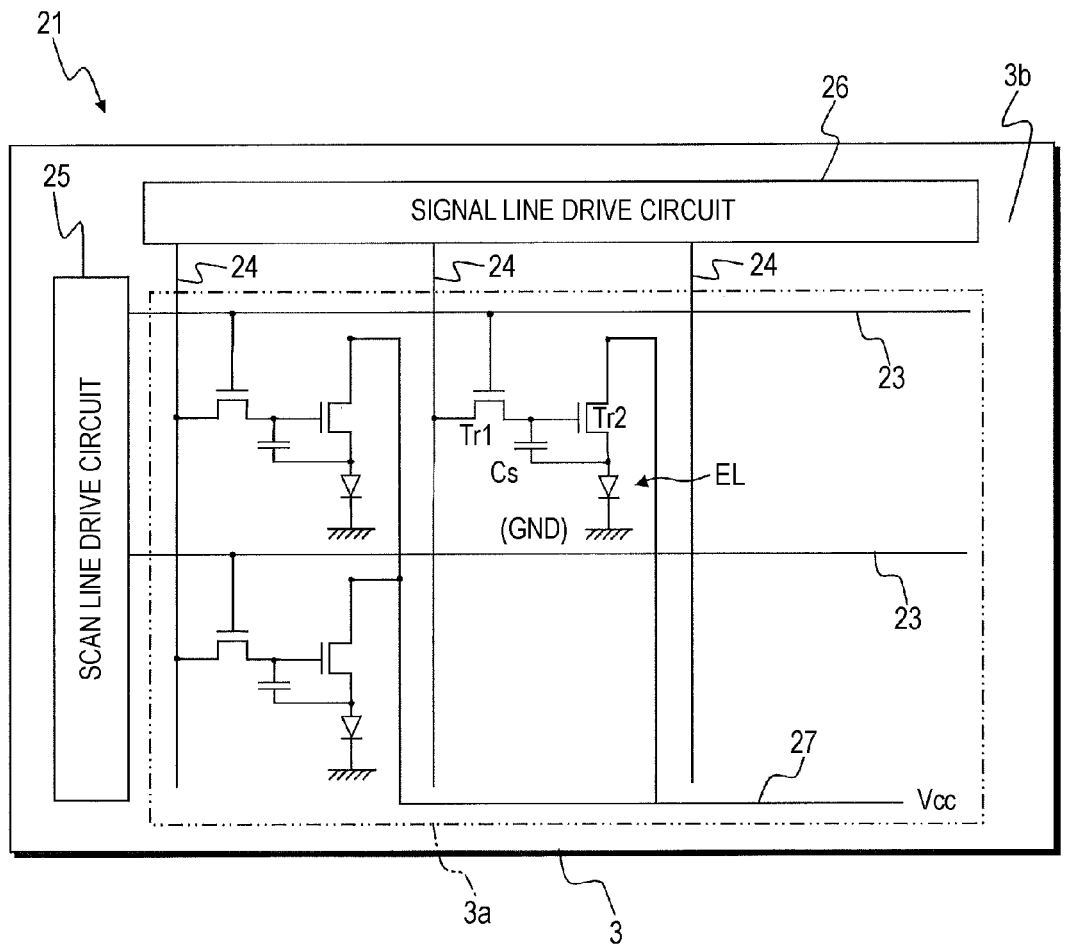
FIG. 7 is a diagram illustrating a display device using an organic electroluminescent device of an embodiment of the present invention.

FIG. 7 is a circuit diagram representing an example of a display device configured with the organic electroluminescent device according to the First to Sixth Embodiments. The following description of the present embodiment will be given through the case where the present invention is applied to a display device 21 of an active-matrix type using the organic electroluminescent device.

As illustrated in the figure, a display region 3a and a peripheral region 3b are defined on a substrate 3 of the display device 21. The display region 3a includes a plurality of scan lines 23 and a plurality of signal lines 24 that are wired in rows and columns to form a pixel array portion in which a pixel is provided corresponding to each intersection. The peripheral region 3b includes a scan line drive circuit 25 that scans and drives scan lines 23, and a signal line drive circuit 26 that supplies video signals corresponding to luminance information (input signals) to the signal lines 24.

The pixel circuit provided at each intersection of the scan lines 23 and the signal lines 24 is configured to include, for example, a switching thin-film transistor Tr1, a driving thin-film transistor Tr2, a hold capacitor Cs, and an organic electroluminescent device EL. The organic electroluminescent device EL is any one of the organic electroluminescent devices (1-1 to 1-6) of the configurations described in the First to Sixth Embodiments.

By the drive of the scan line drive circuit 25, the video signals written into the signal line 24 via the switching thin-film transistor Tr1 are held in the hold capacitor Cs. Further, a current corresponding to the amount of signals held in the hold capacitor Cs is supplied from the driving thin-film transistor Tr2 to the lower electrode or to the lower electrode wire of the organic electroluminescent device EL, so that the organic electroluminescent device EL can emit light in a luminance corresponding to the current value. The driving thin-film transistor Tr2 and the hold capacitor Cs are connected to a common power supply line (Vcc) 27. The upper electrode and the upper electrode-side organic electrode film and the wire of the organic electroluminescent device EL are provided as a common electrode to the all pixels, and connected to GND.

The configuration of the pixel circuit described above is merely an example, and may additionally include a capacitive element in the pixel circuit, or may be configured using a plurality of transistors, as needed. Further, additional drive circuits are provided in the peripheral region 3b as necessitated by changes made to the pixel circuit.

Figure 8:
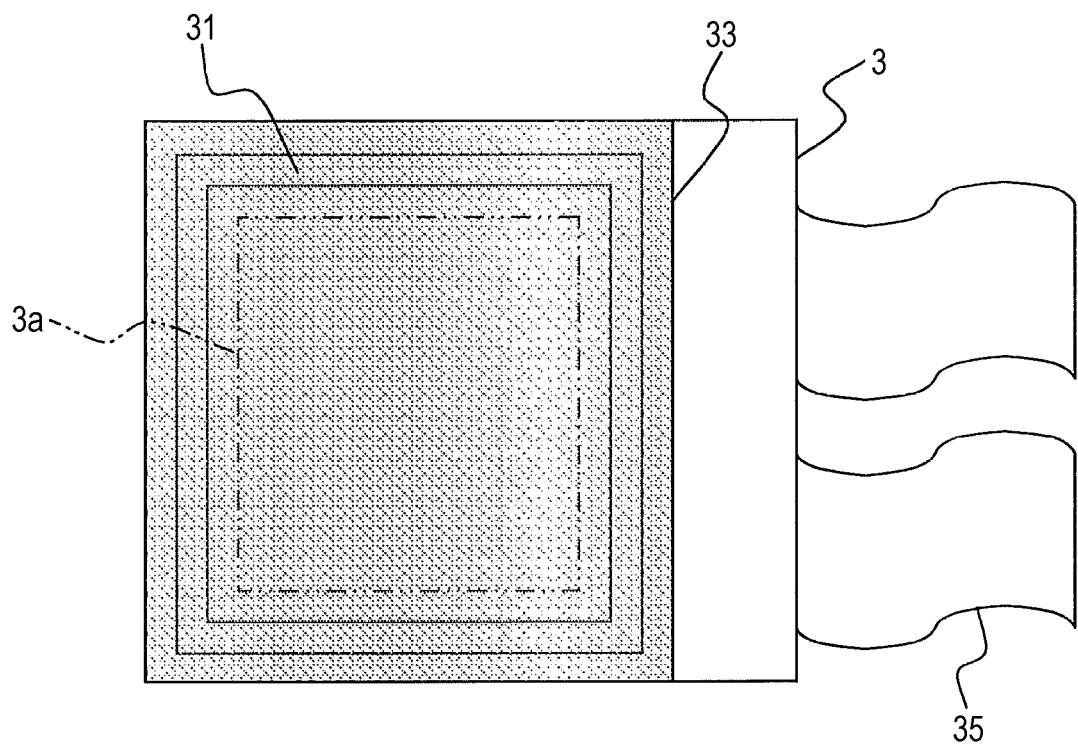
FIG. 8 is a diagram illustrating a modular display device of a sealed configuration using the present invention.

The display device 21 according to an embodiment of the present invention may have a sealed modular configuration as illustrated in FIG. 8. An example of such a configuration is a display module in which a sealing portion 31 is provided around the display region 3a (pixel array portion), and in which the sealing portion 31 is used as an adhesive to make bonding to an opposing member (sealing substrate 33) such as a transparent glass. The transparent sealing substrate 33 may include, for example, a color filter, a protective film, and a light-shielding film. Note that the substrate 3 provided as the display module including the display region 3a may include a flexible print substrate 35 provided to input and output, for example, signals in and out of the display region 3a (pixel array portion) with respect to outside.

In the display device 21 of the foregoing configuration, the organic electroluminescent devices of the First to Sixth Embodiments having good emission efficiency are arrayed on the substrate. Thus, improvements of display characteristics can be expected.

The embodiment has been described through the case where the present invention is applied to an active-matrix display device. However, the present invention is also applicable to passive-matrix display devices, and is equally effective in such devices.

<8. Eighth Embodiment>

FIGS. 9 to 13 illustrate examples of electronic devices using a display device according to an embodiment of the present invention as the display section. A display device according to an embodiment of the present invention is applicable to the display section of a wide range of electronic devices operable to display input video signals to the electronic device, and video signals produced within the electronic device. Examples of electronic devices using the present invention are described below.

Figure 9:
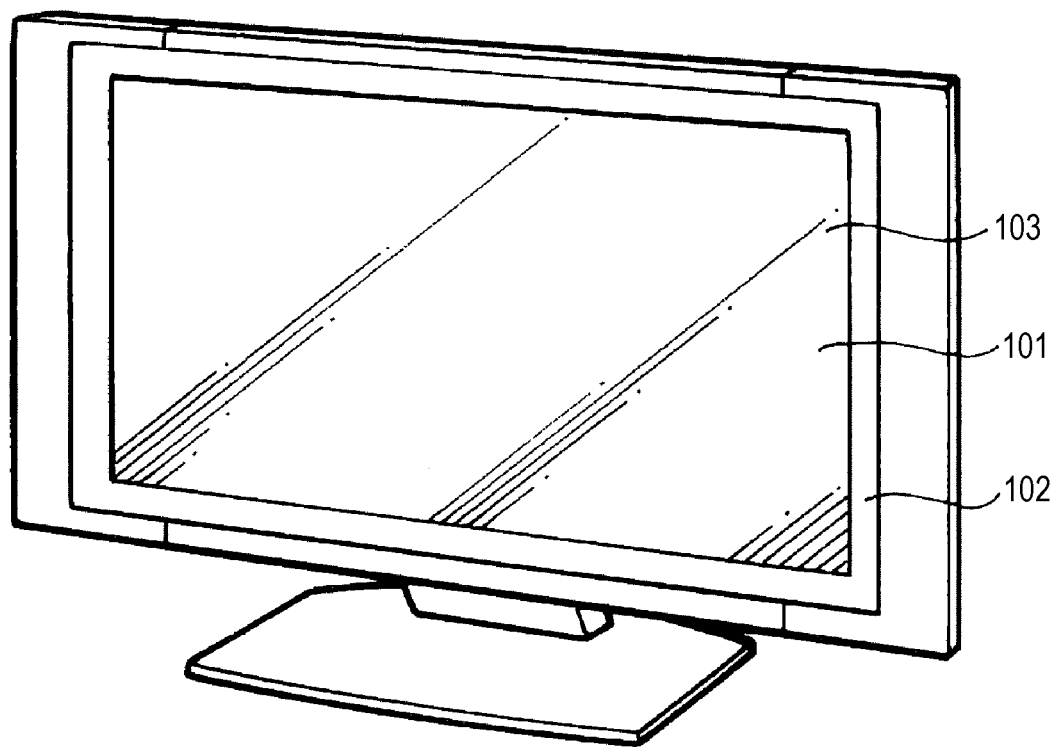
FIG. 9 is a perspective view illustrating a television using a display device of an embodiment of the present invention.

FIG. 9 is a perspective view illustrating a television using the present invention. The television in this example includes a video display screen unit 101 assembled from components such as a front panel 102 and a filter glass 103, and employs a display device according to an embodiment of the present invention is used as the video display screen unit 10.

Figure 10A:
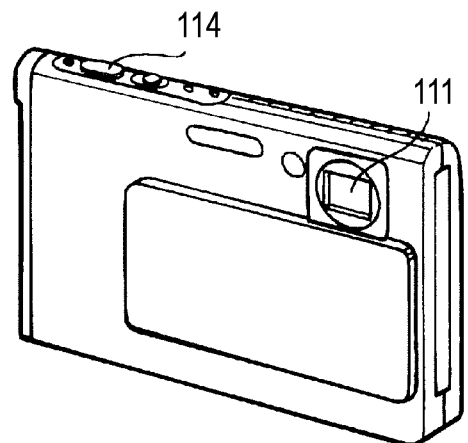
Figure 10B:
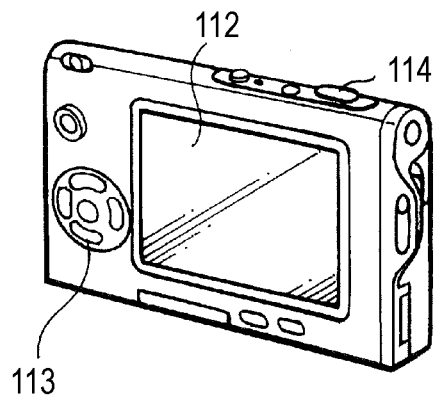

FIGS. 10A and 10B are diagrams illustrating a digital camera using the present invention; FIG. 10A, a front perspective view; FIG. 10B, a rear perspective view. The digital camera in this example includes, for example, a light-emitting section 111 for flashing, a display section 112, a menu switch 113, and a shutter button 114. A display device according to an embodiment of the present invention is used for the display section 112.

Figure 11:
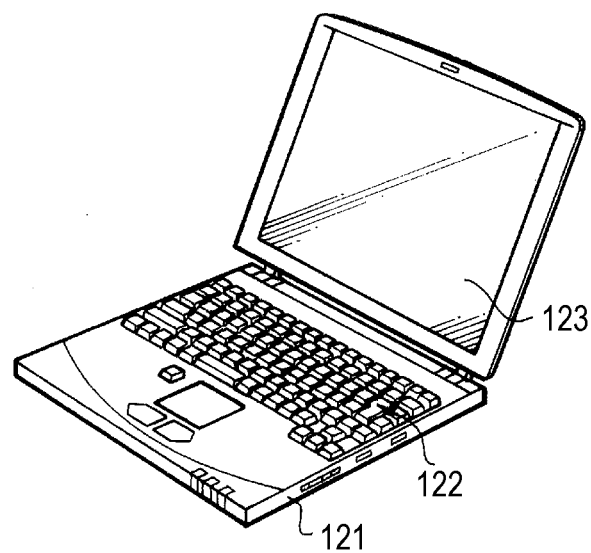
FIG. 11 is a perspective view illustrating a laptop personal computer using a display device of an embodiment of the present invention.

FIG. 11 is a perspective view illustrating a laptop personal computer using the present invention. The laptop personal computer in this example includes, for example, a main body 121, a keyboard 122 used for entering characters or the like, and a display section 123 used to display images. A display device according to an embodiment of the present invention is used for the display section 123.

Figure 12:
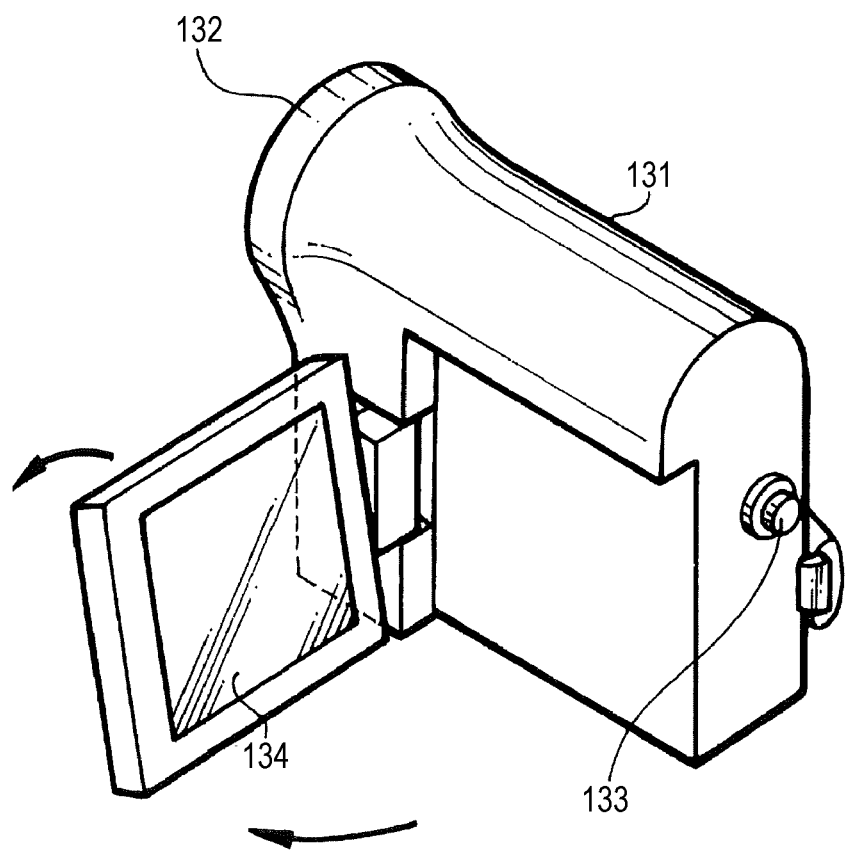
FIG. 12 is a perspective view illustrating a video camera using a display device of an embodiment of the present invention.

FIG. 12 is a perspective view illustrating a video camera using the present invention. The video camera in this example includes, for example, a main body 131, a lens 132 provided on the side to capture images of an object facing the lens, a start/stop switch 133 to start and stop shooting, and a display section 134. A display device according to an embodiment of the present invention is used for the display section 134.

FIGS. 13A to 13G are diagrams illustrating a portable terminal device using the present invention, for example, a cellular phone; FIG. 13A, an open front view; FIG. 13B, an open side view; FIG. 13C, a closed front view; FIG. 13D, a left side view; FIG. 13E, a right side view; FIG. 13F, a top view; FIG. 13G, a bottom view. The cellular phone in this example includes, for example, an upper housing 141, a lower housing 142, a joint (hinge portion) 143, a display 144, a sub-display 145, a picture light 146, and a camera 147. A display device according to an embodiment of the present invention is used for the display 144 and the sub-display 145.

EXAMPLES

The following describes the procedures of producing organic electroluminescent devices based on specific Examples 1 to 7 of the present invention, and Comparative Examples 1 and 2, followed by the results of evaluation of these devices.

Example 1

The organic electroluminescent device 1-1 suited for top-emission described with reference to FIG. 1 was produced as follows.

(a) Anode 5:

The anode 5 was formed by depositing an ITO (thickness of 200 nm) onto a glass substrate 3, using an RF magnetron sputtering method.

(b) Organic Emission Functional Layer 7:

The hole transport layer 7a of αNPD below was vapor deposited on the anode 5 in a thickness of 60 nm. The deposition rate was 0.1 nm/sec. Then, the electron transporting organic emissive layer 7b of Alq3 below was vapor deposited thereon in a thickness of 40 nm. The deposition rate was 0.1 nm/sec.

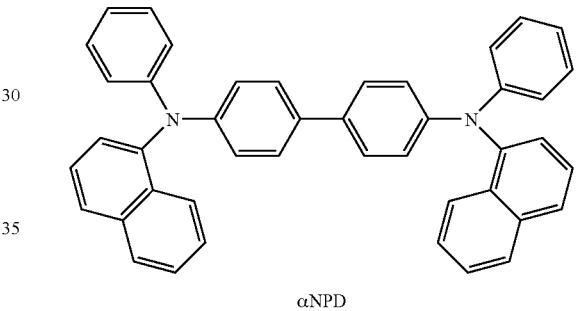

αNPD

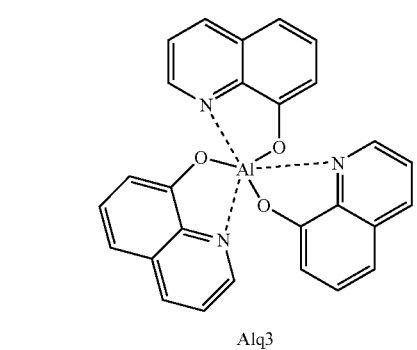

Alq3

(c) Cathode 9:

The first layer of cathode 9 made of LiF was vapor deposited on the organic emission functional layer 7 in a thickness of 0.3 nm. The deposition rate was 0.01 nm/sec. Then, the second layer of cathode 9 made of Mg—Ag was co-vapor deposited in a thickness of 4 nm (Mg:Ag=10:1).

(d) Organic Electrode Film 11:

The layer 11a of ADN below (polycyclic aromatic hydrocarbon compound) was vapor deposited on the cathode 9 in a thickness of 100 nm. The deposition rate was 0.3 nm/sec. Then, the layer 11b of compound (2)-13 below (benzoimidazole derivative) was vapor deposited in a thickness of 5 nm.

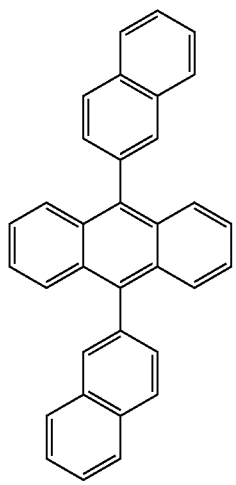

ADN (Polycyclic aromatic hydrocarbon compound)

Compound (2)-13

(Benzoimidazole derivative)

(e) Cathode Wire 13:

The first layer of cathode wire 13 made of LiF was vapor deposited on the organic electrode film 11 in a thickness of 0.3 nm. The deposition rate was 0.01 nm/sec. Then, the second layer of cathode wire 13 made of Mg—Ag was co-vapor deposited in a thickness of 10 nm (Mg:Ag=10:1).

(f) The organic electroluminescent device 1-1 of FIG. 1 suited for top-emission produced as above was then coated with a silicon nitride film (thickness of 1,000 nm) formed by a plasma CVD method.

The organic electroluminescent device 1-1 emitted light of a 430 cd/m² luminance with a drive voltage of 7.8 V under a current flow of 100 mA/cm².

Example 2

Modification was made to (d) the organic electrode film 11 of Example 1, as follows. The compound (3)-1 below was vapor deposited as the azatriphenylene derivative on the cathode 9 in a thickness of 5 nm. The deposition rate was 0.3 nm/sec. Then, as in Example 1, the layer 11a of ADN, and the layer 11b of compound(2)-13 were successively deposited to form an organic electrode film 11 of a three-layer structure. The organic electroluminescent device 1-1 of FIG. 1 suited for top-emission was produced in this manner. The other procedures are the same as in Example 1.

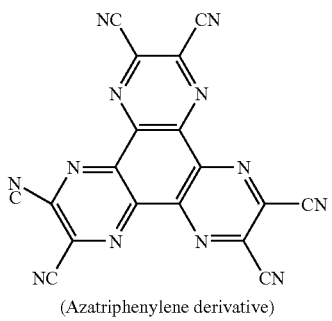

Compound (3)-1

(Azatriphenylene derivative)

The organic electroluminescent device 1-1 emitted light of a 425 cd/m² luminance with a drive voltage of 7.5 V under a current flow of 100 mA/cm².

Example 3

Modification was made to (d) the organic electrode film 11 of Example 1, as follows. The compound (3)-1 as the azatriphenylene derivative, and αNPD as the amine-based material were co-vapor deposited on the cathode 9 in a thickness of 100 nm. The deposition rates were 0.28 nm/sec and 0.01 nm/sec for compound (3)-1 and αNPD, respectively. As a result, an organic electrode film 11 of a single-layer structure was formed. The organic electroluminescent device 1-1 of FIG. 1 suited for top-emission was produced in this manner. The other procedures are the same as in Example 1.

The organic electroluminescent device 1-1 emitted light of a 406 cd/m² luminance with a drive voltage of 7.7 V under a current flow of 100 mA/cm².

Example 4

Modification was made to (d) the organic electrode film 11 of Example 1, as follows. The layer 11a of rubrene below was vapor deposited as the polycyclic aromatic hydrocarbon compound on the cathode 9 in a thickness of 100 nm. This was followed by the vapor deposition of the layer 11b of compound (2)-13 as the benzoimidazole derivative in a thickness of 5 nm. As a result, an organic electrode film 11 of a stacked structure was formed. The organic electroluminescent device 1-1 of FIG. 1 suited for top-emission was produced in this manner. The other procedures are the same as in Example 1.

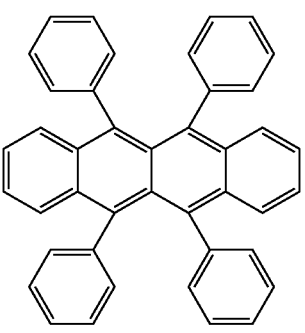

Rubrene
(Polycyclic aromatic hydrocarbon compound)

The organic electroluminescent device 1-1 emitted light of a 427 cd/m² luminance with a drive voltage of 8.2 V under a current flow of 100 mA/cm².

Example 5

The reverse stacked organic electroluminescent device 1-2 suited for top-emission described with reference to FIG. 2 was produced as follows.

(a) Cathode 9:

ITO was deposited on a glass substrate 3 in a thickness of 200 nm, using an RF magnetron sputtering method. Then, Mg—Ag was co-vapor deposited in a thickness of 4 nm (Mg:Ag=10:1). This was followed by the vapor deposition of LiF in a thickness of 0.3 nm. The deposition rate was 0.01 nm/sec.

(b) Organic Emission Functional Layer 7:

The electron transporting organic emissive layer 7b of Alq3 was vapor deposited on the cathode 9 in a thickness of 40 nm. The deposition rate was 0.1 nm/sec. Then, the hole transport layer 7a of αNPD was vapor deposited in a thickness of 60 nm. The deposition rate was 0.1 nm/sec. This was followed by the vapor deposition of the compound(3)-1 of hexanitrile azatriphenylene as the hole injection layer in a thickness of 10 nm. The deposition rate was 0.01 nm/sec.

(c) Anode 5:

Mg—Ag was co-vapor deposited on the organic emission functional layer 7 in a thickness of 4 nm (Mg:Ag=10:1) to form the anode 5.

(d) Organic Electrode Film 11:

The layer 11b of compound(2)-13 was vapor deposited as the benzoimidazole derivative on the anode 5 in a thickness of 5 nm. Then, the layer 11a of ADN was vapor deposited as the polycyclic aromatic hydrocarbon compound in a thickness of 100 nm. The deposition rate was 0.3 nm/sec.

(e) Anode Wire 15:

Mg—Ag was co-vapor deposited on the organic electrode film 11 in a thickness of 10 nm (Mg:Ag=10:1).

(f) The reverse stacked organic electroluminescent device 1-2 of FIG. 2 suited for top-emission produced as above was then coated with a silicon nitride film (thickness of 1,000 nm) formed by a plasma CVD method.

The organic electroluminescent device 1-2 emitted light of a 380 cd/m² luminance with a drive voltage of 7.9 V under a current flow of 100 mA/cm².

Example 6

The reverse stacked organic electroluminescent device 1-4 suited for top-and-bottom emission described with reference to FIG. 4 was produced as follows.

(a) Cathode Wire 13:

ITO was deposited on a glass substrate 3 in a thickness of 200 nm, using an RF magnetron sputtering method. Then, Mg—Ag was co-vapor deposited in a thickness of 4 nm (Mg:Ag=10:1).

(b) Organic Electrode Film 11':

The layer 11b of compound (2)-13 was vapor deposited as the benzoimidazole derivative on the cathode wire 13 in a thickness of 5 nm. Then, the layer 11a of ADN was vapor deposited as the polycyclic aromatic hydrocarbon compound in a thickness of 100 nm. The deposition rate was 0.3 nm/sec.

(c) Cathode 9:

Mg—Ag was co-vapor deposited on the organic electrode film 11' in a thickness of 4 nm (Mg:Ag=10:1). This was followed by the vapor deposition of LiF in a thickness of 0.3 nm. The deposition rate was 0.01 nm/sec.

Then, the organic emission functional layer 7, the anode 5, the organic electrode film 11, and the anode wire 15 were formed according to the procedures (b) to (f) of Example 5 to produce the reverse stacked organic electroluminescent device 1-4 of FIG. 4 suited for top-and-bottom emission, followed by formation of the silicon nitride film.

The organic electroluminescent device 1-4 emitted light of a 320 cd/m² luminance with a drive voltage of 8.0 V under a current flow of 100 mA/cm².

Example 7

Modification was made to (a) the cathode wire 13 of Example 6, as follows. Only the ITO was deposited onto the glass substrate 3 in a thickness of 200 nm, using an RF magnetron sputtering method.

Modification was made to (b) the organic electrode film 11' of Example 6, as follows. The compound(3)-1 as the azatriphenylene derivative, and αNPD as the amine-based material were co-vapor deposited on the cathode wire 13 in a thickness of 100 nm. The deposition rates were 0.28 nm/sec and 0.01 nm/sec for the azatriphenylene derivative and the αNPD, respectively. As a result, an organic electrode film 11 of a single layer structure was formed. The reverse stacked organic electroluminescent device 1-4 of FIG. 4 suited for top-and-bottom emission was formed in this manner. The other procedures are as in Example 6.

The organic electroluminescent device 1-4 emitted light of a 380 cd/m² luminance with a drive voltage of 8.0 V under a current flow of 100 mA/cm².

Comparative Example 1

Modification was made to (d) the organic electrode film of Example 1, as follows. The compound (2)-17 (benzoimidazole derivative) below was vapor deposited on the cathode 9 in a thickness of 100 nm. The deposition rate was 0.3 nm/sec. This was followed by the vapor deposition of Alq3 (5 nm). The organic electroluminescent device suited for top emission was formed in this manner. The other procedures are the same as in Example 1. Note that the Alp3 used to form the organic electrode film 11 is not a "polycyclic aromatic hydrocarbon compound having a backbone of 3- to 7-membered rings" used in combination with the benzoimidazole derivative in the present invention.

(2)-17

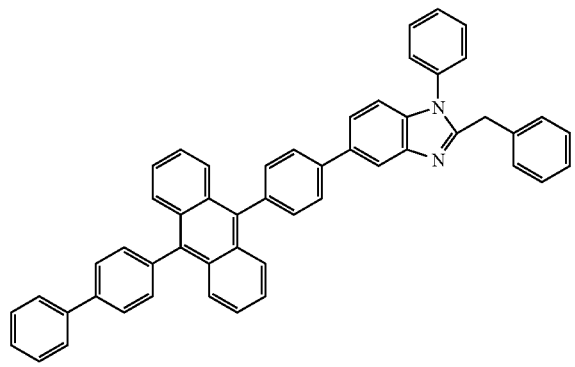

The organic electroluminescent device emitted light of a 340 cd/m² luminance with a drive voltage of 9.8 V under a current flow of 100 mA/cm².

Comparative Example 2

Modification was made to (d) the organic electrode film 11 of Example 1, as follows. The layer of ADN (polycyclic aromatic hydrocarbon compound) was vapor deposited on the cathode 9 in a thickness of 100 nm. The deposition rate was 0.3 nm/sec. This was followed by the vapor deposition of the compound (4) below in a thickness of 5 nm. The organic electroluminescent device suited for top emission was formed in this manner. The other procedures are the same as in Example 1. Note that the compound (4) used to form the organic electrode film 11 is not a "benzoimidazole derivative having a substituent in the benzene ring" used in combination with the polycyclic aromatic hydrocarbon compound in the present invention.

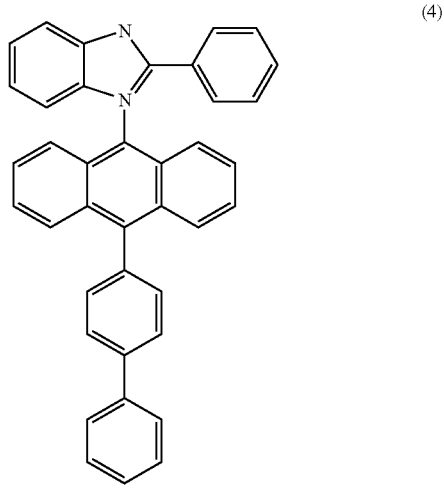

(4)

The organic electroluminescent device emitted light of a 420 cd/m² luminance with a drive voltage of 9.6 V under a current flow of 100 mA/cm².

Results of Evaluation

Table 2 below presents the structures and the characteristic material configurations of Examples 1 to 7 and Comparative Examples 1 and 2, along with the drive voltage and luminance under a driving current of 100 mA/cm².

TABLE 2

| | Structure | Organic electrode film 11' | Organic electrode film 11 | Drive voltage (100 mA/cm²) | Luminance (cd/m²) |
|---|---|---|---|---|---|
| EX. 1 | FIG. 1 | None | ADN/(2)-13 | 7.8 | 430 |
| EX. 2 | | | (3)-1/ADN/(2)-13 | 7.5 | 425 |
| EX. 3 | | | (3)-1 + αNPD | 7.7 | 406 |
| EX. 4 | | | Rubrene/(2)-13 | 8.2 | 427 |
| EX. 5 | FIG. 2 | | (2)-13/ADN | 7.9 | 380 |
| EX. 6 | FIG. 4 | (2)-13/ADN | (2)-13/ADN | 8.0 | 320 |
| EX. 7 | | (3)-1 + αNPD | (2)-13/ADN | 8.0 | 380 |
| Com. Ex. 1 | FIG. 1 | None | (2)-17/Alq3 | 9.8 | 340 |
| Com. Ex. 2 | | | ADN/(4) | 9.6 | 420 |

The materials of organic electrode films 11' and 11 presented in the stacked order from the substrate side.

As can be seen in Table 2, it was confirmed that the organic electroluminescent devices of Examples 1 to 7 using the present invention can be driven at lower drive voltages than in Comparative Examples 1 and 2 not using the present invention.

The present application contains subject matter related to that disclosed in Japanese Priority Patent Application JP 2009-092853 filed in the Japan Patent Office on Apr. 7, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An organic electroluminescent device, comprising:
a substrate;
an anode comprising an inorganic conducting material above the substrate;
a cathode comprising an inorganic conducting material above the substrate;
an organic emission functional layer interposed between the anode and the cathode, the organic emission functional layer comprising an organic emissive layer;
an organic electrode film comprising (a) a first layer of a polycyclic aromatic hydrocarbon compound having a backbone of 3- to 7-membered rings and (b) a second layer of a benzoimidazole derivative having a substituent in the benzene ring, the organic electrode film being provided such that the first layer is disposed in contact with an outer side of the cathode or the second layer is disposed in contact with an outer side of the anode; and
an electrode wire on an outer side of the organic electrode film, the electrode wire being above the organic electrode film, the anode, the cathode and the substrate.

2. The organic electrolurninescent device of claim 1, wherein the backbone of the polycyclic aromatic hydrocarbon compound is selected from anthracene, pyrene, benzopyrene, chrysene, naphthacene, benzonaphthacene, dibenzonaphthacene, perylene, and coronene.

3. The organic electroluminescent device of claim 2, wherein the polycyclic aromatic hydrocarbon is an anthracene derivative represented by the following general formula (1)

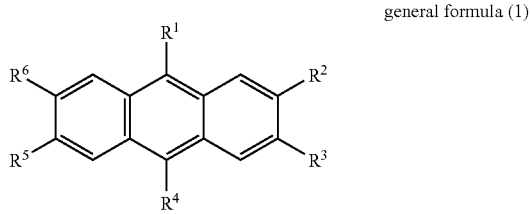

general formula (1)

wherein $R^1$ to $R^6$ each independently represent hydrogen, halogen, a hydroxyl group, an optionally substituted carbonyl group of 20 or less carbon atoms, an optionally substituted carbonyl ester group of 20 or less carbon atoms, an optionally substituted alkyl group of 20 or less carbon atoms, an optionally substituted alkenyl group of 20 or less carbon atoms, an optionally substituted alkoxyl group of 20 or less carbon atoms, a cyano group, a nitro group, an optionally substituted silyl group of 30 or less carbon atoms, an optionally substituted aryl group of 30 or less carbon atoms, an optionally substituted heterocyclic group of 30 or less carbon atoms, or an optionally substituted amino group of 30 or less carbon atoms.

4. The organic electroluminescent device of claim 1, wherein the benzoimidazole derivative is represented by the following general formula (2)

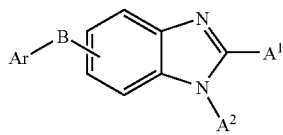

general formula (2)

wherein:
$A^1$ and $A^2$ each independently represents a hydrogen atom, an optionally substituted aryl group of 60 or less carbon atoms, an optionally substituted heterocyclic group, an optionally substituted alkyl group of 1 to 20 carbon atoms, or an optionally substituted alkoxy group of 1 to 20 carbon atoms;
B represents an optionally substituted arylene group of 60 or less carbon atoms, an optionally substituted pyridinylene group, an optionally substituted quinolinylene group, or an optionally substituted fluorenylene group; and
Ar represents an optionally substituted aryl group of 6 to 60 carbon atoms, an optionally substituted heterocyclic group of 3 to 60 carbon atoms, an optionally substituted alkyl group of 1 to 20 carbon atoms, or an optionally substituted alkoxy group of 1 to 20 carbon atoms.

5. The organic electroluminescent device of claim 1, wherein the anode or the cathode in contact with the organic electrode film is provided on the side from which light is drawn.

6. The organic electroluminescent device of claim 5, wherein the light produced by the organic emissive layer is resonated between the anode and the cathode so as to be drawn from one of the anode and the cathode.

7. A display device comprising a plurality of organic electroluminescent devices arrayed on a substrate, the organic electroluminescent devices each including:
an anode comprising an inorganic conducting material above the substrate;
a cathode comprising an inorganic conducting material above the substrate;
an organic emission functional layer interposed between the anode and the cathode, the organic emission functional layer comprising an organic emissive layer;
an organic electrode film comprising (a) a first layer of a polycyclic aromatic hydrocarbon compound having a backbone of 3- to 7-membered rings and (b) a second layer of a benzoimidazole derivative having a substituent in the benzene ring, the organic electrode film being provided such that the first layer is disposed in contact with an outer side of the cathode or the second layer is disposed in contact with an outer side of the anode; and
an electrode wire on an outer side of the organic electrode film, the electrode wire being above the organic electrode film, the anode, the cathode and the substrate.

8. The display device of claim 7, wherein the backbone of the polycyclic aromatic hydrocarbon compound is selected from anthracene, pyrene, benzopyrene, chrysene, naphthacene, benzonaphthacene, dibenzonaphthacene, perylene, and coronene.

9. The display device of claim 8, wherein the polycyclic aromatic hydrocarbon is an anthracene derivative represented by the following general formula (1).

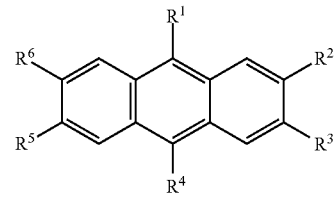

general formula (1)

wherein $R^1$ to $R^6$ each independently represent hydrogen, halogen, a hydroxyl group, an optionally substituted carbonyl group of 20 or less carbon atoms, an optionally substituted carbonyl ester group of 20 or less carbon atoms, an optionally substituted alkyl group of 20 or less carbon atoms, an optionally substituted alkenyl group of 20 or less carbon atoms, an optionally substituted alkoxyl group of 20 or less carbon atoms, a cyano group, a nitro group, an optionally substituted silyl group of 30 or less carbon atoms, an optionally substituted aryl group of 30 or less carbon atoms, an optionally substituted heterocyclic group of 30 or less carbon atoms, or an optionally substituted amino group of 30 or less carbon atoms.

10. The display device of claim 7, wherein the benzoimidazole derivative is represented by the following general formula (2)

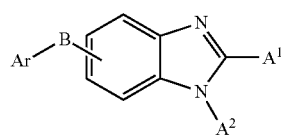

general formula (2)

wherein:
$A^1$ and $A^2$ each independently represents a hydrogen atom, an optionally substituted aryl group of 60 or less carbon atoms, an optionally substituted heterocyclic group, an optionally substituted alkyl group of 1 to 20 carbon atoms, or an optionally substituted alkoxy group of 1 to 20 carbon atoms;
B represents an optionally substituted arylene group of 60 or less carbon atoms, an optionally substituted pyridinylene group, an optionally substituted quinolinylene group, or an optionally substituted fluorenylene group; and
Ar represents an optionally substituted aryl group of 6 to 60 carbon atoms, an optionally substituted heterocyclic group of 3 to 60 carbon atoms, an optionally substituted alkyl group of 1 to 20 carbon atoms, or an optionally substituted alkoxy group of 1 to 20 carbon atoms.

11. The display device of claim 7, wherein the anode or the cathode in contact with the organic electrode film is provided on the side from which light is drawn.

12. The display device of claim 11, wherein the light produced by the organic emissive layer is resonated between the anode and the cathode so as to be drawn from one of the anode and the cathode.

* * * * *